US012641810B2

(12) United States Patent
Lin et al.

(10) Patent No.: US 12,641,810 B2
(45) Date of Patent: May 26, 2026

(54) SEMICONDUCTOR PRODUCT WITH LOW-LEAKAGE CURRENT AND METHOD FOR FORMING THE SAME

(71) Applicant: TAIWAN SEMICONDUCTOR MANUFACTURING COMPANY LTD., Hsinchu (TW)

(72) Inventors: Yi-Hsiung Lin, Hsinchu County (TW); Chieh Chih Ting, Hsinchu (TW); Simon Yaou-Dong Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/340,116

(22) Filed: Jun. 7, 2021

(65) Prior Publication Data

US 2022/0393017 A1 Dec. 8, 2022

(51) Int. Cl.
*H10D 30/01* (2025.01)
*H10D 30/60* (2025.01)
*H10P 30/20* (2026.01)
*H10P 30/22* (2026.01)

(52) U.S. Cl.
CPC ......... *H10D 30/022* (2025.01); *H10D 30/601* (2025.01); *H10P 30/204* (2026.01); *H10P 30/21* (2026.01); *H10P 30/22* (2026.01)

(58) Field of Classification Search
CPC ......... H01L 29/66492; H01L 21/26513; H01L 21/266; H01L 29/7833; H01L 29/6659; H01L 29/66659; H01L 21/823412; H10D 84/40; H10D 84/83; H10D 84/856–857; H10D 30/601; H10D 30/0227
See application file for complete search history.

(56) References Cited

U.S. PATENT DOCUMENTS

| | | | | |
|---|---|---|---|---|
| 6,262,456 B1 * | 7/2001 | Yu | ...................... | H01L 29/66545 257/370 |
| 6,628,551 B2 * | 9/2003 | Jain | ...................... | G11C 11/4091 257/E21.654 |
| 2011/0151642 A1 * | 6/2011 | Chang | ................. | H01L 29/0847 257/E21.334 |
| 2015/0228645 A1 * | 8/2015 | Chuang | ............. | H01L 29/66636 438/290 |

* cited by examiner

*Primary Examiner* — Syed I Gheyas
(74) *Attorney, Agent, or Firm* — WPAT LAW; Anthony King

(57) ABSTRACT

A method for manufacturing a semiconductor product is provided. The method comprises forming a semiconductor device within a wafer utilizing a predetermined number of masks. The method further comprises forming a first low-leakage semiconductor device within the wafer utilizing a first set of additional masks. The first low-leakage semiconductor device has a lower leakage current than that of the semiconductor device.

20 Claims, 13 Drawing Sheets

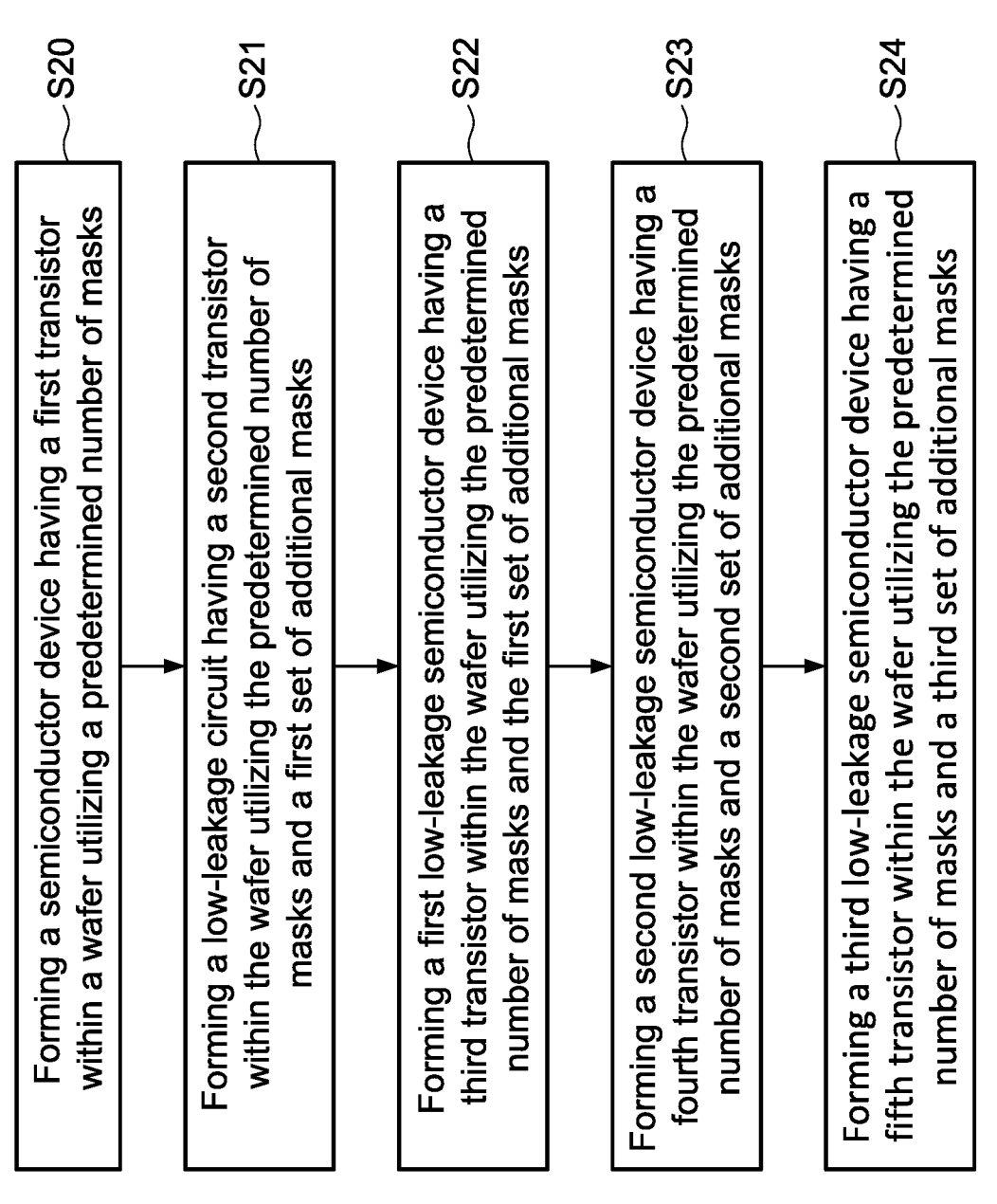

S20 — Forming a semiconductor device having a first transistor within a wafer utilizing a predetermined number of masks S21 — Forming a low-leakage circuit having a second transistor within the wafer utilizing the predetermined number of masks and a first set of additional masks S22 — Forming a first low-leakage semiconductor device having a third transistor within the wafer utilizing the predetermined number of masks and the first set of additional masks S23 — Forming a second low-leakage semiconductor device having a fourth transistor within the wafer utilizing the predetermined number of masks and a second set of additional masks S24 — Forming a third low-leakage semiconductor device having a fifth transistor within the wafer utilizing the predetermined number of masks and a third set of additional masks

FIG. 6B

SEMICONDUCTOR PRODUCT WITH LOW-LEAKAGE CURRENT AND METHOD FOR FORMING THE SAME

BACKGROUND

The present disclosure relates, in general, to semiconductor products and methods for manufacturing the same. Specifically, the present disclosure relates to semiconductor products and methods for manufacturing semiconductor products with low leakage current.

Low-leakage current devices have been widely used for various applications, such as artificial intelligence of things (AIoT), always-on circuits and watchdog devices, due to low power consumption. However, increased number of masks are required for fabricating such devices, which can increase manufacturing costs and limit adoption by users.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

FIG. 6B illustrates a flow chart including operations for manufacturing a semiconductor product, in accordance with some embodiments of the present disclosure.

DETAILED DESCRIPTION

Figure 1A:
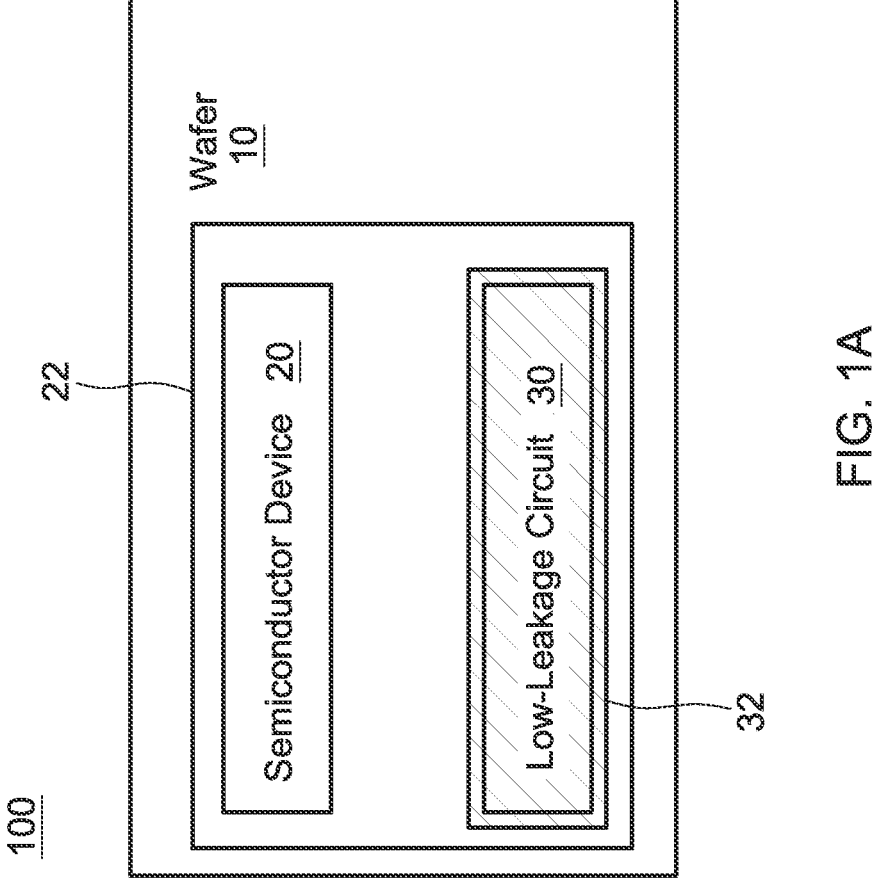
FIG. 1A illustrates a top view of a semiconductor product, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A illustrates a top view of a semiconductor product 100, in accordance with some embodiments of the present disclosure.

FIG. 1A shows a semiconductor product 100. The semiconductor product 100 can be an electrical device. The semiconductor product 100 can be a system of integrated circuits (IC). The semiconductor product 100 includes a wafer 10, a semiconductor device 20, and a low-leakage circuit 30. The amounts of semiconductor devices 20 and low-leakage circuits 30 are not limited. In some embodiments, the semiconductor product 100 may include more than one semiconductor device 20 or more than one low-leakage circuit 30.

The semiconductor device 20 is formed within the wafer 10. The semiconductor device 20 is formed on the wafer 10. The semiconductor device 20 can include at least one transistor, and the transistor can be an n-channel MOSFET or a p-channel MOSFET. The semiconductor device 20 can be formed using a predetermined number of masks 22.

The low-leakage circuit 30 is formed within the wafer 10. The low-leakage circuit 30 is formed on the wafer 10. The low-leakage circuit 30 can include at least one transistor, and the transistor can be an n-channel MOSFET or a p-channel MOSFET. The low-leakage circuit 30 can be used to execute specific electronic functions. The low-leakage circuit 30 can be a memory device. The low-leakage circuit 30 can be SRAM (Static Random Access Memory).

The low-leakage circuit 30 can be formed using a first set of additional masks 32. The low-leakage circuit 30 can be formed using the predetermined number of masks 22 and the first set of additional masks 32. In some embodiments, the number of the first set of additional masks 32 can be identical to the predetermined number. In some embodiments, the number of the first set of additional masks 32 can be different from the predetermined number. The first set of additional masks 32 can be identical to the predetermined number of masks 22. The first set of additional masks 32 can be different from the predetermined number of masks 22. The number of masks for manufacturing the low-leakage circuit 30 can be different from the number of masks for manufacturing the semiconductor device 20. The number of masks for manufacturing the low-leakage circuit 30 can be greater than the number of masks for manufacturing the semiconductor device 20.

In some embodiments, the first set of additional masks 32 includes one additional mask. In some embodiments, the first set of additional masks 32 includes two additional masks. In some embodiments, the first set of additional masks 32 includes more than two additional masks.

The leakage current of the low-leakage circuit 30 can be different from that of the semiconductor device 20. The leakage current of the low-leakage circuit 30 can be lower than that of the semiconductor device 20. The semiconductor product 100 can include devices (i.e., the semiconductor device 20 and the low-leakage circuit 30) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in both the forming of the semiconductor device 20 and the low-leakage circuit 30), the cost of manufacturing variety of device types can be decreased.

The threshold voltage of the transistor of the low-leakage circuit 30 can be different from that of the semiconductor device 20. The threshold voltage of the transistor of the low-leakage circuit 30 can be higher than that of the semiconductor device 20. The implant concentration of the channel of the low-leakage circuit 30 can be different from that of the semiconductor device 20. The implant concentration of the channel of the low-leakage circuit 30 can be higher than that of the semiconductor device 20. The details regarding the implant concentration of the channel will be further discussed in accordance with FIG. 5.

Figure 1B:
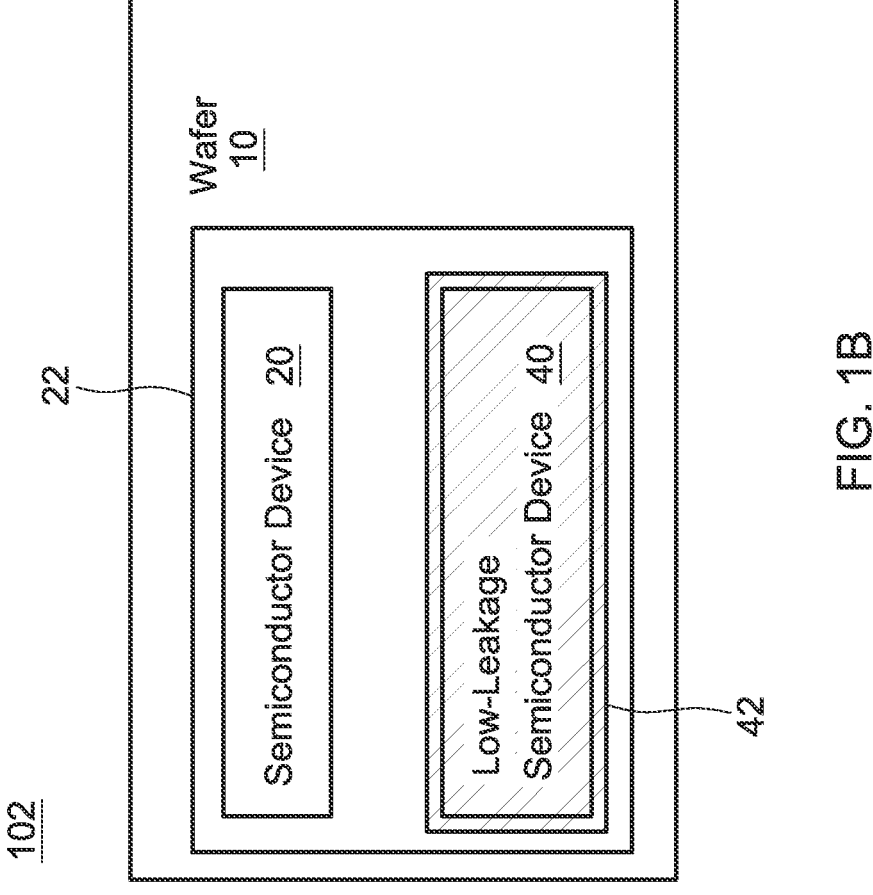
FIG. 1B illustrates a top view of a semiconductor product, in accordance with some embodiments of the present disclosure.

FIG. 1B illustrates a top view of a semiconductor product 102, in accordance with some embodiments of the present disclosure. The semiconductor product 102 includes a wafer 10, a semiconductor device 20 and a low-leakage semiconductor device 40. The number of the low-leakage semiconductor device 40 is not limited. In some embodiments, the semiconductor product 102 may include more than one low-leakage semiconductor device 40.

The semiconductor device 20 is formed within the wafer 10. The semiconductor device 20 is formed on the wafer 10. The semiconductor device 20 can include a transistor, and the transistor can be an n-channel MOSFET or a p-channel MOSFET. The semiconductor device 20 can be formed using a predetermined number of masks 22.

The low-leakage semiconductor device 40 is formed within the wafer 10. The low-leakage semiconductor device 40 is formed on the wafer 10. The low-leakage semiconductor device 40 can include a transistor, and the transistor can be an n-channel MOSFET or a p-channel MOSFET.

The low-leakage semiconductor device 40 can be formed using a first set of additional masks 42. The low-leakage semiconductor device 40 can be formed using the predetermined number of masks 22 and the first set of additional masks 42. The number of the first set of additional masks 42 can be identical to the predetermined number. The number of the first set of additional masks 42 can be different from the predetermined number. The number of masks for manufacturing the low-leakage semiconductor device 40 can be different from the number of masks for manufacturing the semiconductor device 20. The number of masks for manufacturing the low-leakage semiconductor device 40 can be greater than the number of masks for manufacturing the semiconductor device 20.

In some embodiments, the first set of additional masks 42 includes one additional mask. In some embodiments, the first set of additional masks 42 includes two additional masks. In some embodiments, the first set of additional masks 42 includes more than two additional masks.

The leakage current of the low-leakage semiconductor device 40 can be different from that of the semiconductor device 20. The leakage current of the low-leakage semiconductor device 40 can be lower than that of the semiconductor device 20. The semiconductor product 102 can include devices (i.e., the semiconductor device 20 and the low-leakage semiconductor device 40) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in both the forming of the semiconductor device 20 and the low-leakage semiconductor device 40), the cost of manufacturing variety of device types can be decreased.

The threshold voltage of the transistor of the low-leakage semiconductor device 40 can be different from that of the semiconductor device 20. The threshold voltage of the transistor of the low-leakage semiconductor device 40 can be higher than that of the semiconductor device 20. The implant concentration of the channel of the low-leakage semiconductor device 40 can be different from that of the semiconductor device 20. The implant concentration of the channel of the low-leakage semiconductor device 40 can be higher than that of the semiconductor device 20.

Figure 1C:
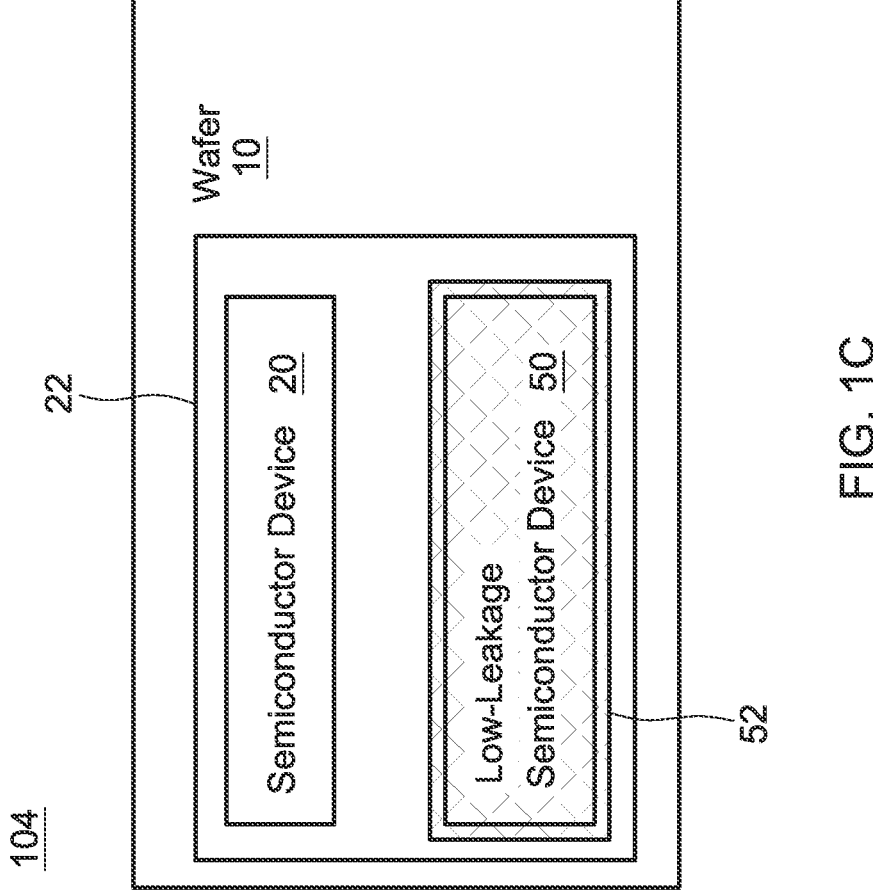
FIG. 1C illustrates a top view of a semiconductor product, in accordance with some embodiments of the present disclosure.

FIG. 1C illustrates a top view of a semiconductor product 104, in accordance with some embodiments of the present disclosure. The semiconductor product 104 includes a wafer 10, a semiconductor device 20 and a low-leakage semiconductor device 50. The number of the low-leakage semiconductor device 50 is not limited. In some embodiments, the semiconductor product 104 may include at least two low-leakage semiconductor devices 50.

The semiconductor device 20 is formed within the wafer 10. The semiconductor device 20 is formed on the wafer 10. The semiconductor device 20 can include a transistor, and the transistor can be an n-channel MOSFET or a p-channel MOSFET. The semiconductor device 20 can be formed using a predetermined number of masks 22.

The low-leakage semiconductor device 50 can be formed within the wafer 10. The low-leakage semiconductor device 50 can be formed on the wafer 10. The low-leakage semiconductor device 50 can include a transistor, and the transistor can be an n-channel MOSFET or a p-channel MOSFET.

The low-leakage semiconductor device 50 can be formed using a second set of additional masks 52. The low-leakage semiconductor device 50 can be formed using the predetermined number of masks 22 and the second set of additional masks 52. The second set of additional masks 52 can be identical to the predetermined number of masks 22. The second set of additional masks 52 can be different from the predetermined number of masks 22. The number of masks for manufacturing the low-leakage semiconductor device 50 can be different from the number of masks for manufacturing the semiconductor device 20. The number of masks for manufacturing the low-leakage semiconductor device 50 can be greater than the number of masks for manufacturing the semiconductor device 20.

In some embodiments, the second set of additional masks 52 includes one additional mask. In some embodiments, the second set of additional masks 52 includes two additional masks. In some embodiments, the second set of additional masks 52 includes more than two additional masks.

The second set of additional masks 52 can be identical to the first set of additional masks 42 in the embodiments of FIG. 1B. The second set of additional masks 52 can be different from the first set of additional masks 42 in the embodiments of FIG. 1B. The number of the second set of additional masks 52 can be the same as that of that of the first set of additional masks 42 in the embodiments of FIG. 1B. The number of the second set of additional masks 52 can be different from that of that of the first set of additional masks 42 in the embodiments of FIG. 1B. The number of the second set of additional masks 52 can be greater than that of the first set of additional masks 42 in the embodiments of FIG. 1B. The number of the second set of additional masks 52 can be lower than that of the first set of additional masks 42 in the embodiments of FIG. 1B.

The leakage current of the low-leakage semiconductor device 50 is different from that of the semiconductor device 20. The leakage current of the low-leakage semiconductor device 50 is lower than that of the semiconductor device 20. The leakage current of the semiconductor product 104 can be reduced by adopting the low-leakage semiconductor device 50. The low-leakage semiconductor device 50 can reduce more leakage current than that of the low-leakage semiconductor device 40.

The semiconductor product 104 can include devices (i.e., the semiconductor device 20 and the low-leakage semiconductor device 50) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in both the forming of the semiconductor device 20 and the low-leakage semiconductor device 50), the cost of manufacturing variety of device types can be decreased.

In addition, the leakage current of the low-leakage semiconductor device 50 can be different from that of the low-leakage semiconductor device 40 in FIG. 1B. The leakage current of the low-leakage semiconductor device 50 can be lower than that of the low-leakage semiconductor device 40 in FIG. 1B.

The threshold voltage of the transistor of the low-leakage semiconductor device 50 can be different from that of the semiconductor device 20. The threshold voltage of the transistor of the low-leakage semiconductor device 50 can be higher than that of the semiconductor device 20. The implant concentration of the channel of the low-leakage semiconductor device 50 can be different from that of the semiconductor device 20. The implant concentration of the channel of the low-leakage semiconductor device 50 can be higher than that of the semiconductor device 20.

Furthermore, the threshold voltage of the transistor of the low-leakage semiconductor device 50 can be different from that of the low-leakage semiconductor device 40 in FIG. 1B. The threshold voltage of the transistor of the low-leakage semiconductor device 50 can be higher than that of the low-leakage semiconductor device 40 in FIG. 1B. The implant concentration of the channel of the low-leakage semiconductor device 50 can be different from that of the low-leakage semiconductor device 40. The implant concentration of the channel of the low-leakage semiconductor device 50 can be higher than that of the low-leakage semiconductor device 40.

Figure 1D:
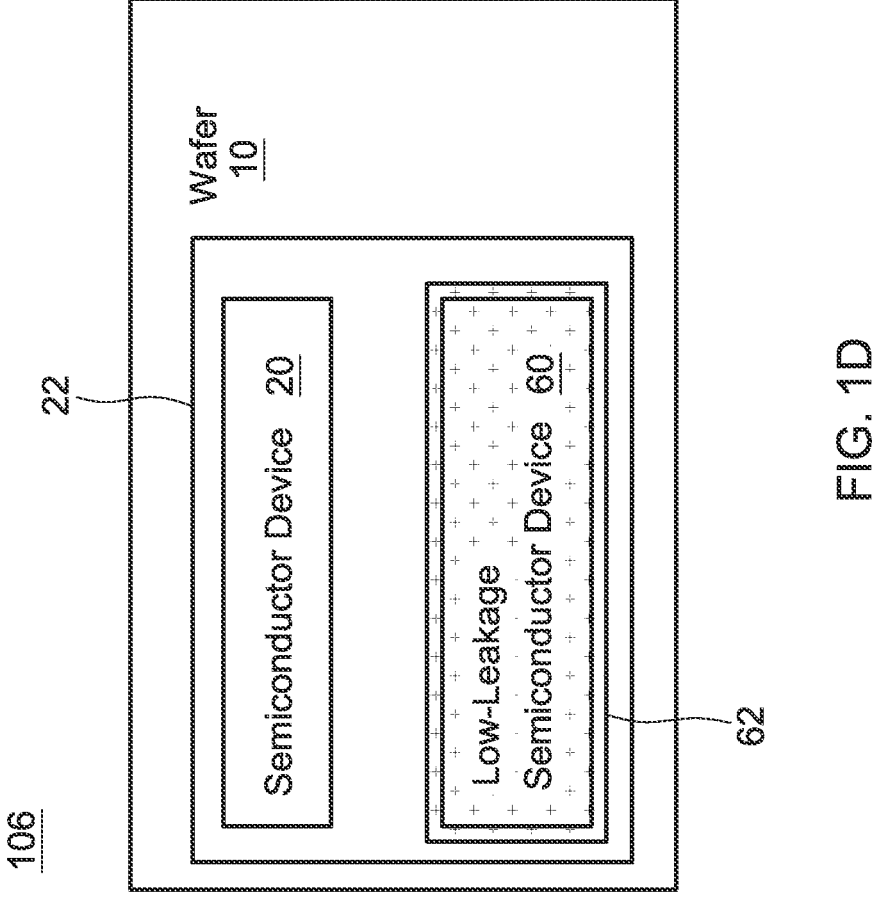
FIG. 1D illustrates a top view of a semiconductor product, in accordance with some embodiments of the present disclosure.

FIG. 1D illustrates a top view of a semiconductor product 106, in accordance with some embodiments of the present disclosure. The semiconductor product 106 includes a wafer 10, a semiconductor device 20 and a low-leakage semiconductor device 60. The number of the low-leakage semiconductor device 60 is not limited. In some embodiments, the semiconductor product 106 may include more than two low-leakage semiconductor devices 60.

The semiconductor device 20 is formed within the wafer 10. The semiconductor device 20 is formed on the wafer 10. The semiconductor device 20 can include a transistor, and the transistor can be an n-channel MOSFET or a p-channel MOSFET. The semiconductor device 20 can be formed using a predetermined number of masks 22.

The low-leakage semiconductor device 60 is formed within the wafer 10. The low-leakage semiconductor device 60 is formed on the wafer 10. The low-leakage semiconductor device 60 can include a transistor, and the transistor can be an n-channel MOSFET or a p-channel MOSFET.

The low-leakage semiconductor device 60 can be formed using a third set of additional masks 62. The low-leakage semiconductor device 60 can be formed using the predetermined number of masks 22 and the third set of additional masks 62. The third set of additional masks 62 can be identical to the predetermined number of masks 22. The third set of additional masks 62 can be different from the predetermined number of masks 22. The number of masks for manufacturing the low-leakage semiconductor device 60 can be different from the number of masks for manufacturing the semiconductor device 20. The number of masks for manufacturing the low-leakage semiconductor device 60 can be greater than the number of masks for manufacturing the semiconductor device 20.

In some embodiments, the third set of additional masks 62 includes one additional mask. In some embodiments, the third set of additional masks 62 includes two additional masks. In some embodiments, the third set of additional masks 62 includes three additional masks. In some embodiments, the third set of additional masks 62 includes four additional masks. In some embodiments, the third set of additional masks 62 includes more than four additional masks.

The third set of additional masks 62 can be identical to the second set of additional masks 52 in the embodiments of FIG. 1C. The third set of additional masks 62 can be different from the second set of additional masks 52 in the embodiments of FIG. 1C. The number of the third set of additional masks 62 can be different from that of that of the second set of additional masks 52 in the embodiments of FIG. 1C. The number of the third set of additional masks 62 can be higher than that of that of the second set of additional masks 52 in the embodiments of FIG. 1C. The number of the third set of additional masks 62 can be greater than that of the second set of additional masks 52 in the embodiments of FIG. 1C. The number of the third set of additional masks 62 can be lower than that of the second set of additional masks 52 in the embodiments of FIG. 1C.

The leakage current of the low-leakage semiconductor device 60 is different from that of the semiconductor device 20. The leakage current of the low-leakage semiconductor device 60 is lower than that of the semiconductor device 20. The leakage current of the semiconductor product 106 can be reduced by adopting the low-leakage semiconductor device 60. The low-leakage semiconductor device 60 can reduce leakage current more than the low-leakage semiconductor device 50.

The semiconductor product 106 can include devices (i.e., the semiconductor device 20 and the low-leakage semiconductor device 60) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in both the forming of the semiconductor device 20 and the low-leakage semiconductor device 60), the cost of manufacturing variety of device types can be decreased.

In addition, the leakage current of the low-leakage semiconductor device 60 can be different from that of the low-leakage semiconductor device 50 in FIG. 1C. The leakage current of the low-leakage semiconductor device 60 can be lower than that of the low-leakage semiconductor device 50 in FIG. 1C.

The threshold voltage of the transistor of the low-leakage semiconductor device 60 can be different from that of the semiconductor device 20. The threshold voltage of the transistor of the low-leakage semiconductor device 60 can be higher than that of the semiconductor device 20. The implant concentration of the channel of the low-leakage semiconductor device 60 can be different from that of the semiconductor device 20. The implant concentration of the channel of the low-leakage semiconductor device 60 can be higher than that of the semiconductor device 20.

Furthermore, the threshold voltage of the transistor of the low-leakage semiconductor device 60 can be different from that of the low-leakage semiconductor device 50 in FIG. 1C. The threshold voltage of the transistor of the low-leakage semiconductor device 60 can be higher than that of the low-leakage semiconductor device 50 in FIG. 1C. The implant concentration of the channel of the low-leakage semiconductor device 60 can be different from that of the low-leakage semiconductor device 50. The implant concentration of the channel of the low-leakage semiconductor device 60 can be higher than that of the low-leakage semiconductor device 50.

In addition, the transistor of the low-leakage semiconductor device 60 has lightly doped drain (LDD) to further reduce the leakage current. The structure of the LDD will be discussed in accordance with FIG. 5.

Specifically, concentration of a first portion of a drain adjacent to the channel of the transistor of the low-leakage semiconductor device 60 is different from that of the drain of the transistor of the semiconductor device 20. Concentration of a first portion of a drain adjacent to the channel of the transistor of the low-leakage semiconductor device 60 is lower than that of the drain of the transistor of the semiconductor device 20.

Concentration of a first portion of a drain adjacent to the channel of the transistor of the low-leakage semiconductor device 60 is different from that of the drain of the transistor of the low leakage circuit 30. Concentration of a first portion of a drain adjacent to the channel of the transistor of the low-leakage semiconductor device 60 is lower than that of a drain of the transistor of the low leakage circuit 30.

Concentration of a first portion of a drain adjacent to the channel of the transistor of the low-leakage semiconductor device 60 is different from that of a drain of the transistor of the semiconductor device 40. Concentration of a first portion of a drain adjacent to the channel of the transistor of the low-leakage semiconductor device 60 is lower than that of a drain of the transistor of the semiconductor device 40.

Concentration of a first portion of a drain adjacent to the channel of the transistor of the low-leakage semiconductor device 60 is different from that of a drain of the transistor of the semiconductor device 50. Concentration of a first portion of a drain adjacent to the channel of the transistor of the low-leakage semiconductor device 60 is lower than that of a drain of the transistor of the semiconductor device 50.

Figure 2A:
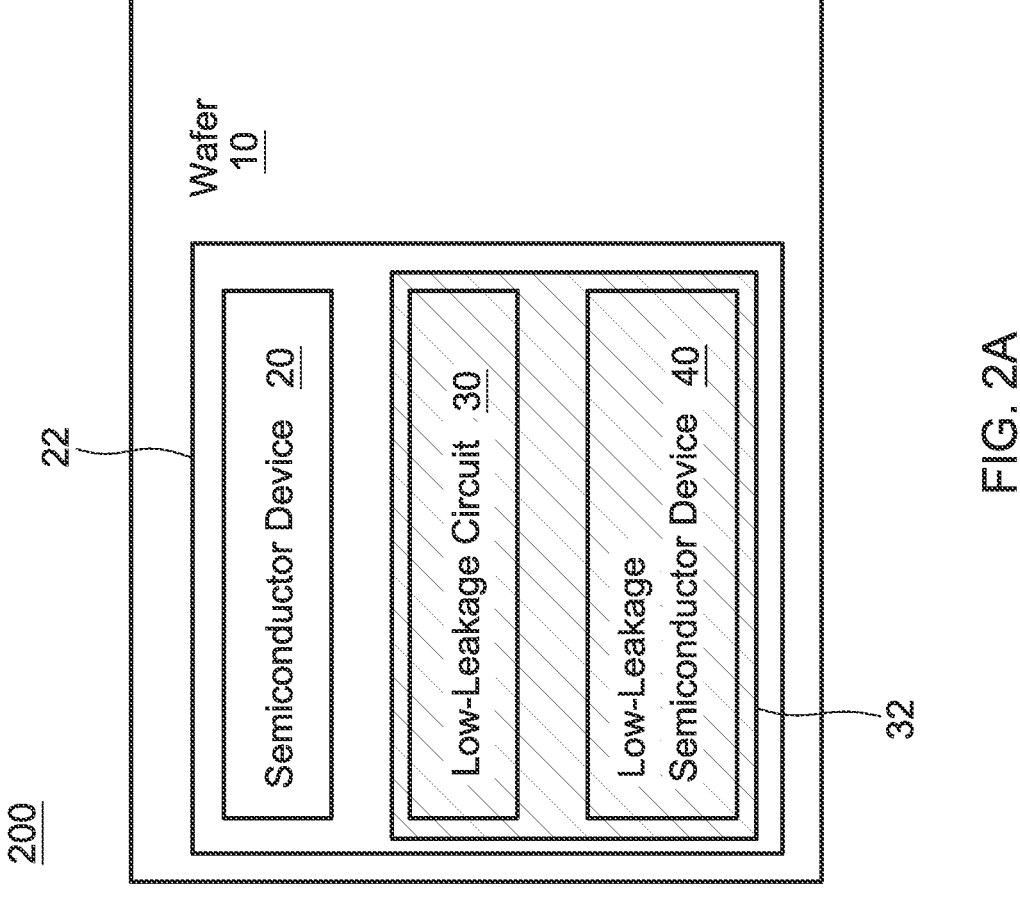
FIG. 2A illustrates a top view of a semiconductor product, in accordance with some embodiments of the present disclosure.

FIG. 2A illustrates a top view of a semiconductor product 200, in accordance with some embodiments of the present disclosure. The semiconductor product 200 includes a wafer 10, a semiconductor device 20, a low-leakage circuit 30 and a low-leakage semiconductor device 40. The numbers of the semiconductor device 20, the low-leakage circuit 30 and the low-leakage semiconductor device 40 are not limited. In some embodiments, the semiconductor product 200 may include at least two semiconductor devices 20, at least two low-leakage circuits 30 or at least two low-leakage semiconductor devices 40.

The semiconductor device 20 is formed within the wafer 10. The semiconductor device 20 is formed on the wafer 10. The semiconductor device 20 can include at least one transistor, and the transistor can be an n-channel MOSFET or a p-channel MOSFET. The semiconductor device 20 can be formed using a predetermined number of masks 22.

The low-leakage circuit 30 is formed within the wafer 10. The low-leakage circuit 30 is formed on the wafer 10. The low-leakage circuit 30 can include at least one transistor, and the transistor can be an n-channel MOSFET or a p-channel MOSFET. The low-leakage circuit 30 can be used to execute specific electronic function. The low-leakage circuit 30 can be a memory device. The low-leakage circuit 30 can be SRAM.

The low-leakage semiconductor device 40 is formed within the wafer 10. The low-leakage semiconductor device 40 is formed on the wafer 10. The low-leakage semiconductor device 40 can include a transistor, and the transistor can be an n-channel MOSFET or a p-channel MOSFET.

The low-leakage circuit 30 and the low-leakage semiconductor device 40 can be formed using a first set of additional masks 32. The first set of additional masks 32 can be used to form both of the low-leakage circuit 30 and the low-leakage semiconductor device 40. The low-leakage circuit 30 and the low-leakage semiconductor device 40 can be formed using the predetermined number of masks 22 and the first set of additional masks 32.

The number of masks for manufacturing the low-leakage circuit 30 and the low-leakage semiconductor device 40 is different from the number of masks for manufacturing the semiconductor device 20. The number of masks for manufacturing the low-leakage circuit 30 and the low-leakage semiconductor device 40 is greater than the number of masks for manufacturing the semiconductor device 20.

In some embodiments, the first set of additional masks 32 includes one additional mask. In some embodiments, the first set of additional masks 32 includes two additional masks. In some embodiments, the first set of additional masks 32 includes more than two additional masks.

The first set of additional masks 32 can be shared during the manufacturing process of forming the low-leakage circuit 30 and the low-leakage semiconductor device 40. The first set of additional masks 32 can be used to fabricate the low-leakage circuit 30 and the low-leakage semiconductor device 40 at the same manufacturing process. Therefore, the total number of masks for manufacturing the semiconductor product 200 can be reduced. The efficiency of fabricating the semiconductor product 200 can be improved. The cost for fabricating the semiconductor product 200 can be reduced.

The leakage current of the low-leakage circuit 30 is different from that of the semiconductor device 20. The leakage current of the low-leakage circuit 30 is lower than that of the semiconductor device 20. The semiconductor product 200 can include devices (i.e., the semiconductor device 20, the low-leakage circuit 30 and the low-leakage semiconductor device 40) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in the forming of the semiconductor device 20, the low-leakage circuit 30 and the low-leakage semiconductor device 40), the cost of manufacturing variety of device types can be decreased.

The threshold voltage of the transistor of the low-leakage circuit 30 is different from that of the semiconductor device 20. The threshold voltage of the transistor of the low-leakage circuit 30 is higher than that of the semiconductor device 20. The implant concentration of the channel of the low-leakage circuit 30 is different from that of the semiconductor device 20. The implant concentration of the channel of the low-leakage circuit 30 is higher than that of the semiconductor device 20.

The leakage current of the low-leakage semiconductor device 40 is different from that of the semiconductor device 20. The leakage current of the low-leakage semiconductor device 40 is lower than that of the semiconductor device 20. The leakage current of the semiconductor product 200 can be reduced by adopting the low-leakage semiconductor device 40. The low-leakage semiconductor device 40 reduces power consumption for the semiconductor product 200.

The threshold voltage of the transistor of the low-leakage semiconductor device 40 is different from that of the semiconductor device 20. The threshold voltage of the transistor of the low-leakage semiconductor device 40 is higher than that of the semiconductor device 20. The implant concentration of the channel of the low-leakage semiconductor device 40 is different from that of the semiconductor device 20. The implant concentration of the channel of the low-leakage semiconductor device 40 is higher than that of the semiconductor device 20.

The leakage current of the low-leakage semiconductor device 40 can be different from that of the low-leakage circuit 30. The leakage current of the low-leakage semiconductor device 40 can be lower than that of the low-leakage circuit 30. The leakage current of the low-leakage semiconductor device 40 can be higher than that of the low-leakage circuit 30.

The threshold voltage of the transistor of the low-leakage semiconductor device 40 is different from that of the low-leakage circuit 30. The threshold voltage of the transistor of the low-leakage semiconductor device 40 can be higher than that of the low-leakage circuit 30. The threshold voltage of the transistor of the low-leakage semiconductor device 40 can be lower than that of the low-leakage circuit 30. The implant concentration of the channel of the low-leakage semiconductor device 40 can be different from that of the low-leakage circuit 30. The implant concentration of the channel of the low-leakage semiconductor device 40 can be substantially identical to that of the low-leakage circuit 30.

Figure 2B:
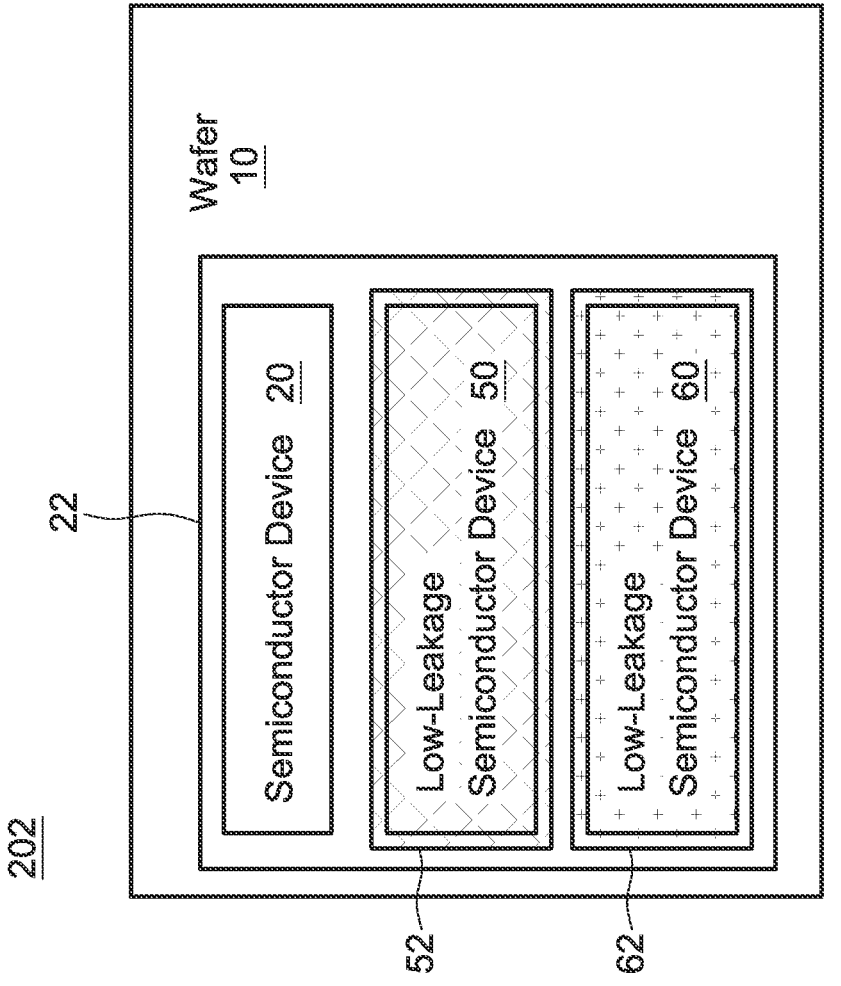
FIG. 2B illustrates a top view of a semiconductor product, in accordance with some embodiments of the present disclosure.

FIG. 2B is a top view of a semiconductor product 202, in accordance with some embodiments of the present disclosure. The semiconductor product 202 includes a wafer 10, a semiconductor device 20, a low-leakage semiconductor device 50 and a low-leakage semiconductor device 60. The numbers of the low-leakage semiconductor device 50 and the low-leakage semiconductor device 60 are not limited. In some embodiments, the semiconductor product 202 can include at least two low-leakage semiconductor devices 50 or at least two low-leakage semiconductor devices 60.

The semiconductor device 20 is formed within the wafer 10. The semiconductor device 20 is formed on the wafer 10. The semiconductor device 20 can include a transistor, and the transistor can be an n-channel MOSFET or a p-channel MOSFET. The semiconductor device 20 can be formed using a predetermined number of masks 22.

The low-leakage semiconductor device 50 is formed within the wafer 10. The low-leakage semiconductor device 50 is formed on the wafer 10. The low-leakage semiconductor device 50 can include a transistor, and the transistor can be an n-channel MOSFET or a p-channel MOSFET.

The low-leakage semiconductor device 50 can be formed using a second set of additional masks 52. The low-leakage semiconductor device 50 can be formed using the predetermined number of masks 22 and the second set of additional masks 52. The number of masks for manufacturing the low-leakage semiconductor device 50 can be different from the number of masks for manufacturing the semiconductor device 20. The number of masks for manufacturing the low-leakage semiconductor device 50 can be greater than the number of masks for manufacturing the semiconductor device 20.

In some embodiments, the second set of additional masks 52 includes one additional mask. In some embodiments, the second set of additional masks 52 includes two additional masks. In some embodiments, the second set of additional masks 52 includes more than two additional masks.

The low-leakage semiconductor device 60 can be formed using a third set of additional masks 62. The low-leakage semiconductor device 60 can be formed using the predetermined number of masks 22 and the third set of additional masks 62. The number of masks for manufacturing the low-leakage semiconductor device 60 can be different from the number of masks for manufacturing the low-leakage semiconductor device 50. The number of masks for manufacturing the low-leakage semiconductor device 60 can be greater than the number of masks for manufacturing the low-leakage semiconductor device 50.

In some embodiments, the third set of additional masks 62 includes one additional mask. In some embodiments, the third set of additional masks 62 includes two additional masks. In some embodiments, the third set of additional masks 62 includes three additional masks. In some embodiments, the third set of additional masks 62 includes four additional masks. In some embodiments, the third set of additional masks 62 includes more than four additional masks.

The leakage currents of the low-leakage semiconductor device 50 and the low-leakage semiconductor device 60 can be different from that of the semiconductor device 20. The leakage currents of the low-leakage semiconductor device 50 and the low-leakage semiconductor device 60 can be lower than that of the semiconductor device 20. The leakage current of the semiconductor product 202 can be reduced by adopting the low-leakage semiconductor device 50 and the low-leakage semiconductor device 60.

The threshold voltages of the transistors of the low-leakage semiconductor device 50 and the low-leakage semiconductor device 60 can be different from that of the semiconductor device 20. The threshold voltages of the transistors of the low-leakage semiconductor device 50 and the low-leakage semiconductor device 60 can be higher than that of the semiconductor device 20. The implant concentration of the channels of the low-leakage semiconductor device 50 and the low-leakage semiconductor device 60 can be different from that of the semiconductor device 20. The implant concentration of the channels of the low-leakage semiconductor device 50 and the low-leakage semiconductor device 60 can be higher than that of the semiconductor device 20.

The leakage current of the low-leakage semiconductor device 60 can be different from that of the low-leakage semiconductor device 50. The leakage current of the low-leakage semiconductor device 60 can be lower than that of the low-leakage semiconductor device 50. The semiconductor product 202 can include devices (i.e., the semiconductor device 20, the low-leakage semiconductor device 50 and the low-leakage semiconductor device 60) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22

(i.e., the predetermined number of masks 22 are utilized in the forming of the semiconductor device 20, the low-leakage semiconductor device 50 and the low-leakage semiconductor device 60), the cost of manufacturing variety of device types can be decreased.

The threshold voltage of the transistor of the low-leakage semiconductor device 60 can be different from that of the low-leakage semiconductor device 50. The threshold voltage of the transistor of the low-leakage semiconductor device 60 can be higher than that of the low-leakage semiconductor device 50. The implant concentration of the channel of the low-leakage semiconductor device 60 can be different from that of the low-leakage semiconductor device 50. The implant concentration of the channel of the low-leakage semiconductor device 60 can be higher than that of the low-leakage semiconductor device 50.

In addition, the transistor of the low-leakage semiconductor device 60 has LDD to further reduce the leakage current. Specifically, concentration of a first portion of a drain adjacent to the channel of the transistor of the low-leakage semiconductor device 60 can be different from that of a drain of the transistor of the semiconductor device 20. Concentration of a first portion of a drain adjacent to the channel of the transistor of the low-leakage semiconductor device 60 can be lower than that of a drain of the transistor of the semiconductor device 20. Concentration of a first portion of a drain adjacent to the channel of the transistor of the low-leakage semiconductor device 60 is different from that of a drain of the transistor of the semiconductor device 50. Concentration of a first portion of a drain adjacent to the channel of the transistor of the low-leakage semiconductor device 60 can be lower than that of a drain of the transistor of the semiconductor device 50.

Figure 3A:
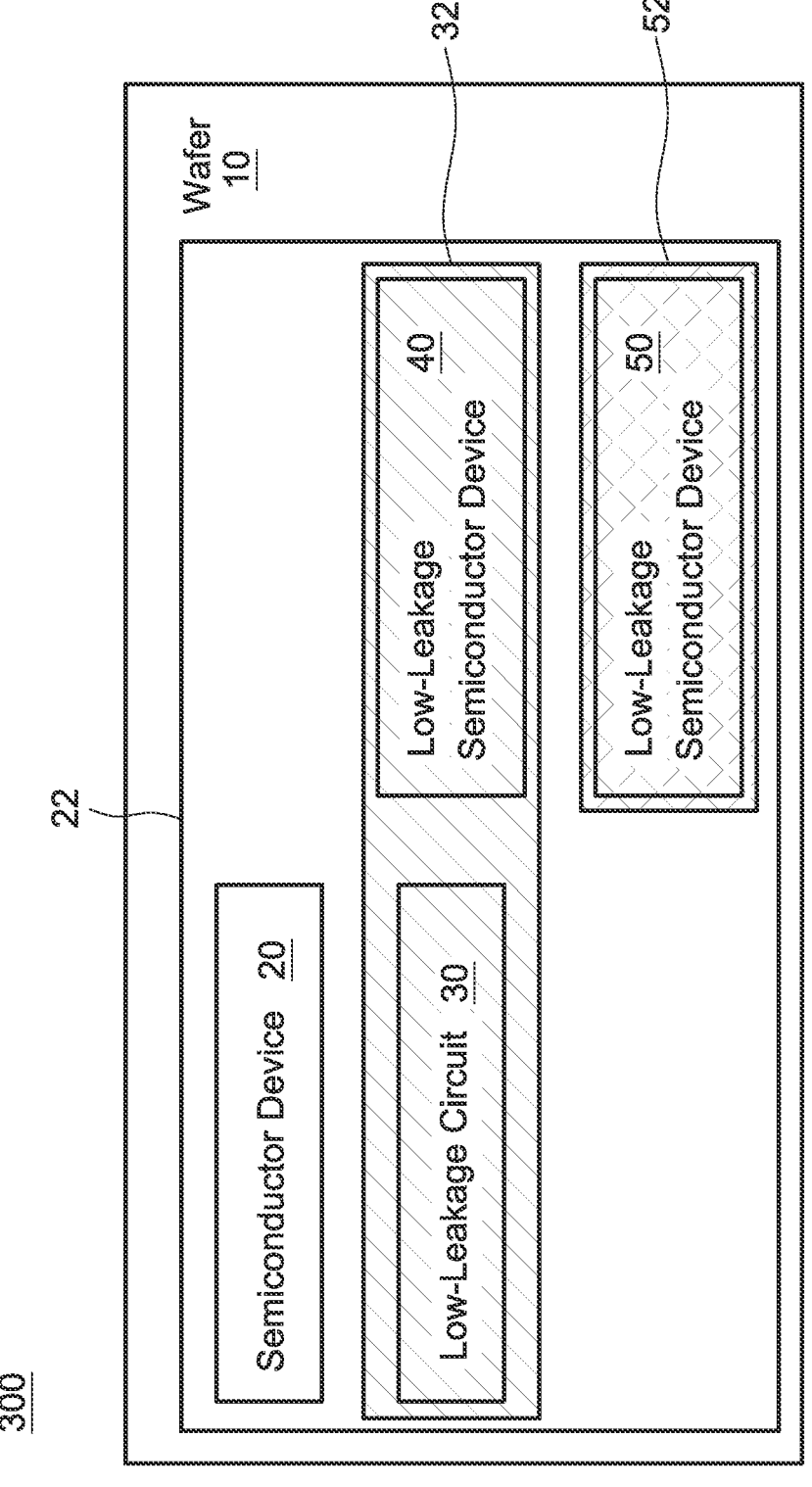
FIG. 3A illustrates a top view of a semiconductor product, in accordance with some embodiments of the present disclosure.

FIG. 3A is a top view of a semiconductor product 300, in accordance with some embodiments of the present disclosure. The semiconductor product 300 includes a wafer 10, a semiconductor device 20, a low-leakage circuit 30, a low-leakage semiconductor device 40 and a low-leakage semiconductor device 50. The numbers of the semiconductor device 20, the low-leakage circuit 30, the low-leakage semiconductor device 40 and low-leakage semiconductor device 50 are not limited.

The semiconductor device 20 is formed within the wafer 10. The semiconductor device 20 is formed on the wafer 10. The semiconductor device 20 can include at least one transistor. The low-leakage circuit 30 is formed within the wafer 10. The low-leakage circuit 30 is formed on the wafer 10. The low-leakage circuit 30 can include at least one transistor. The low-leakage circuit 30 can be used to execute specific electronic function. The low-leakage circuit 30 can be a memory device. The low-leakage circuit 30 can be SRAM.

The low-leakage semiconductor device 40 is formed within the wafer 10. The low-leakage semiconductor device 40 is formed on the wafer 10. The low-leakage semiconductor device 40 can include a transistor, and the transistor can be an n-channel MOSFET or a p-channel MOSFET.

The low-leakage circuit 30 and the low-leakage semiconductor device 40 can be formed using a first set of additional masks 32. The first set of additional masks 32 can be used to form both of the low-leakage circuit 30 and the low-leakage semiconductor device 40. The low-leakage circuit 30 and the low-leakage semiconductor device 40 can be formed using the predetermined number of masks 22 and the first set of additional masks 32.

The number of masks for manufacturing the low-leakage circuit 30 and the low-leakage semiconductor device 40 is different from the number of masks for manufacturing the semiconductor device 20. The number of masks for manufacturing the low-leakage circuit 30 and the low-leakage semiconductor device 40 is greater than the number of masks for manufacturing the semiconductor device 20.

In some embodiments, the first set of additional masks 32 includes one additional mask. In some embodiments, the first set of additional masks 32 includes two additional masks. In some embodiments, the first set of additional masks 32 includes more than two additional masks.

The first set of additional masks 32 can be shared during the manufacturing process of forming the low-leakage circuit 30 and the low-leakage semiconductor device 40. The first set of additional masks 32 can be used to fabricate the low-leakage circuit 30 and the low-leakage semiconductor device 40 at the same manufacturing process. The first set of additional masks 32 can be used to fabricate the low-leakage circuit 30 and the low-leakage semiconductor device 40 at the same time. Therefore, the total number of masks for manufacturing the semiconductor product 300 can be reduced. The efficiency of fabricating the semiconductor product 300 can be improved. The cost for fabricating the semiconductor product 300 can be reduced.

The leakage current of the low-leakage circuit 30 can be different from that of the semiconductor device 20. The leakage current of the low-leakage circuit 30 can be lower than that of the semiconductor device 20. The semiconductor product 300 can include devices (i.e., the semiconductor device 20, the low-leakage circuit 30, the low-leakage semiconductor device 40 and the low-leakage semiconductor device 50) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in the forming of the semiconductor device 20, the low-leakage circuit 30, the low-leakage semiconductor device 40 and the low-leakage semiconductor device 50), the cost of manufacturing variety of device types can be decreased.

The threshold voltage of the transistor of the low-leakage circuit 30 is different from that of the semiconductor device 20. The threshold voltage of the transistor of the low-leakage circuit 30 is higher than that of the semiconductor device 20. The implant concentration of the channel of the low-leakage circuit 30 is different from that of the semiconductor device 20. The implant concentration of the channel of the low-leakage circuit 30 is higher than that of the semiconductor device 20.

The leakage current of the low-leakage semiconductor device 40 can be different from that of the semiconductor device 20. The leakage current of the low-leakage semiconductor device 40 can be lower than that of the semiconductor device 20.

The threshold voltage of the transistor of the low-leakage semiconductor device 40 can be different from that of the semiconductor device 20. The threshold voltage of the transistor of the low-leakage semiconductor device 40 can be higher than that of the semiconductor device 20. The implant concentration of the channel of the low-leakage semiconductor device 40 can be different from that of the semiconductor device 20. The implant concentration of the channel of the low-leakage semiconductor device 40 can be higher than that of the semiconductor device 20.

The low-leakage semiconductor device 50 is formed within the wafer 10. The low-leakage semiconductor device 50 is formed on the wafer 10. The low-leakage semiconductor device 50 can include a transistor, and the transistor can be an n-channel MOSFET or a p-channel MOSFET.

The low-leakage semiconductor device 50 can be formed using a second set of additional masks 52. The low-leakage semiconductor device 50 can be formed using the predetermined number of masks 20 and the second set of additional masks 52. In some embodiments, the second set of additional masks 52 includes one additional mask. In some embodiments, the second set of additional masks 52 includes two additional masks. In some embodiments, the second set of additional masks 52 includes more than two additional masks.

The number of masks for manufacturing the low-leakage semiconductor device 50 can be different from the number of masks for manufacturing the semiconductor device 20. The number of masks for manufacturing the low-leakage semiconductor device 50 can be greater than the number of masks for manufacturing the semiconductor device 20. The number of masks for manufacturing the low-leakage semiconductor device 50 can be identical to the number of masks for manufacturing the low-leakage device 30 and the low-leakage semiconductor device 40. The number of masks for manufacturing the low-leakage semiconductor device 50 can be different from the number of masks for manufacturing the low-leakage device 30 and the low-leakage semiconductor device 40.

Figure 3B:
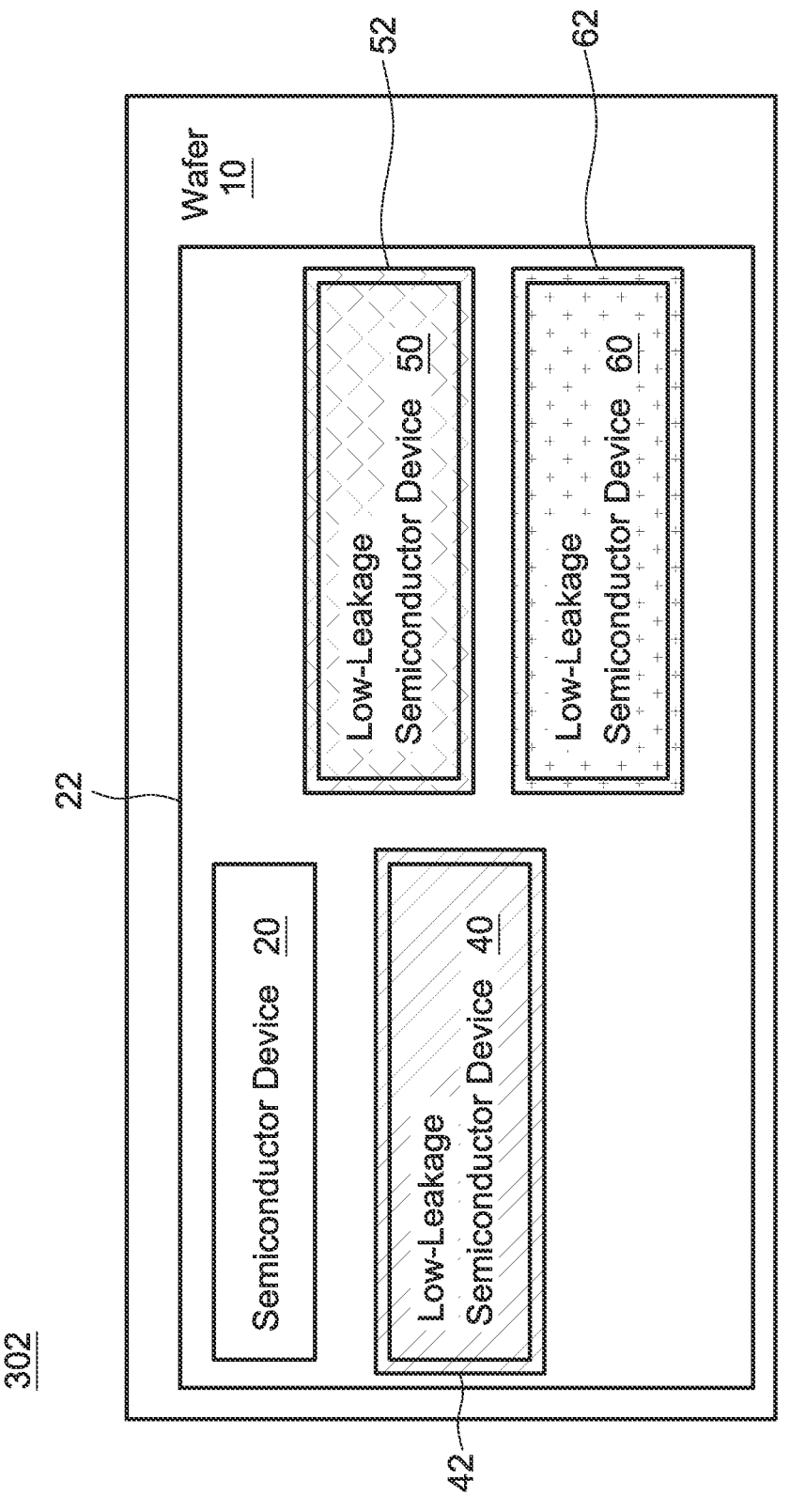
FIG. 3B illustrates a top view of a semiconductor product, in accordance with some embodiments of the present disclosure.

FIG. 3B is a top view of a semiconductor product 302, in accordance with some embodiments of the present disclosure. The semiconductor product 302 includes a wafer 10, a semiconductor device 20, a low-leakage semiconductor device 40, a low-leakage semiconductor device 50 and a low-leakage semiconductor device 60. The numbers of low-leakage semiconductor device 40, the low-leakage semiconductor device 50 and the low-leakage semiconductor device 60 are not limited.

The semiconductor device 20 is formed within the wafer 10 or on the wafer 10. The low-leakage semiconductor device 40 is formed within the wafer 10 or on the wafer 10. The low-leakage semiconductor device 40 can include a transistor, and the transistor can be an n-channel MOSFET or a p-channel MOSFET.

The low-leakage semiconductor device 40 can be formed using a first set of additional masks 42. The low-leakage semiconductor device 40 can be formed using the predetermined number of masks 22 and the first set of additional masks 42. The number of masks for manufacturing the low-leakage semiconductor device 40 can be different from the number of masks for manufacturing the semiconductor device 20. The number of masks for manufacturing the low-leakage semiconductor device 40 can be greater than the number of masks for manufacturing the semiconductor device 20.

In some embodiments, the first set of additional masks 42 includes one additional mask. In some embodiments, the first set of additional masks 42 includes two additional masks. In some embodiments, the first set of additional masks 42 includes more than two additional masks.

The leakage current of the low-leakage semiconductor device 40 is different from that of the semiconductor device 20. The leakage current of the low-leakage semiconductor device 40 is lower than that of the semiconductor device 20. The semiconductor product 302 can include devices (i.e., the semiconductor device 20, the low-leakage semiconductor device 40, the low-leakage semiconductor device 50 and the low-leakage semiconductor device 60) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in the forming of the semiconductor device 20, the low-leakage semiconductor device 40, the low-leakage semiconductor device 50 and the low-leakage semiconductor device 60), the cost of manufacturing variety of device types can be decreased.

The threshold voltage of the transistor of the low-leakage semiconductor device 40 can be different from that of the semiconductor device 20. The threshold voltage of the transistor of the low-leakage semiconductor device 40 can be higher than that of the semiconductor device 20. The implant concentration of the channel of the low-leakage semiconductor device 40 can be different from that of the semiconductor device 20. The implant concentration of the channel of the low-leakage semiconductor device 40 can be higher than that of the semiconductor device 20.

The low-leakage semiconductor device 50 is formed within the wafer 10 or on the wafer 10. The low-leakage semiconductor device 50 can include a transistor, and the transistor can be an n-channel MOSFET or a p-channel MOSFET.

The low-leakage semiconductor device 50 can be formed using a second set of additional masks 52. The low-leakage semiconductor device 50 can be formed using the predetermined number of masks 22 and the second set of additional masks 52. The number of masks for manufacturing the low-leakage semiconductor device 50 can be different from the number of masks for manufacturing low-leakage semiconductor device 40. The number of masks for manufacturing the low-leakage semiconductor device 50 can be greater than the number of masks for manufacturing low-leakage semiconductor device 40.

In some embodiments, the second set of additional masks 52 includes one additional mask. In some embodiments, the second set of additional masks 52 includes two additional masks. In some embodiments, the second set of additional masks 52 includes more than two additional masks.

The low-leakage semiconductor device 60 can be formed using a third set of additional masks 62. The low-leakage semiconductor device 60 can be formed using the predetermined number of masks 22 and the third set of additional masks 62. The number of masks for manufacturing the low-leakage semiconductor device 60 can be different from the number of masks for manufacturing the low-leakage semiconductor device 50. The number of masks for manufacturing the low-leakage semiconductor device 60 can be greater than the number of masks for manufacturing the low-leakage semiconductor device 50.

In some embodiments, the third set of additional masks 62 includes one additional mask. In some embodiments, the third set of additional masks 62 includes two additional masks. In some embodiments, the third set of additional masks 62 includes three additional masks. In some embodiments, the third set of additional masks 62 includes four additional masks. In some embodiments, the third set of additional masks 62 includes more than four additional masks.

The leakage currents of the low-leakage semiconductor device 60 can be different from that of the low-leakage semiconductor device 50. The leakage currents of the low-leakage semiconductor device 60 can be lower than that of the low-leakage semiconductor device 50. The leakage current of the semiconductor product 302 can be reduced by adopting the low-leakage semiconductor device 40, the low-leakage semiconductor device 50 and the low-leakage semiconductor device 60.

In addition, the transistor of the low-leakage semiconductor device 60 has LDD to further reduce the leakage current. Specifically, concentration of a first portion of a drain adjacent to the channel of the transistor of the low-leakage semiconductor device 60 can be different from that of a drain of the transistor of the semiconductor device 20. Concentration of a first portion of a drain adjacent to the channel of the transistor of the low-leakage semiconductor device 60 can be lower than that of a drain of the transistor of the semiconductor device 20. Concentration of a first portion of a drain adjacent to the channel of the transistor of the low-leakage semiconductor device 60 can be different from that of a drain of the transistor of the semiconductor device 50. Concentration of a first portion of a drain adjacent to the channel of the transistor of the low-leakage semiconductor device 60 can be lower than that of a drain of the transistor of the semiconductor device 50.

Figure 4:
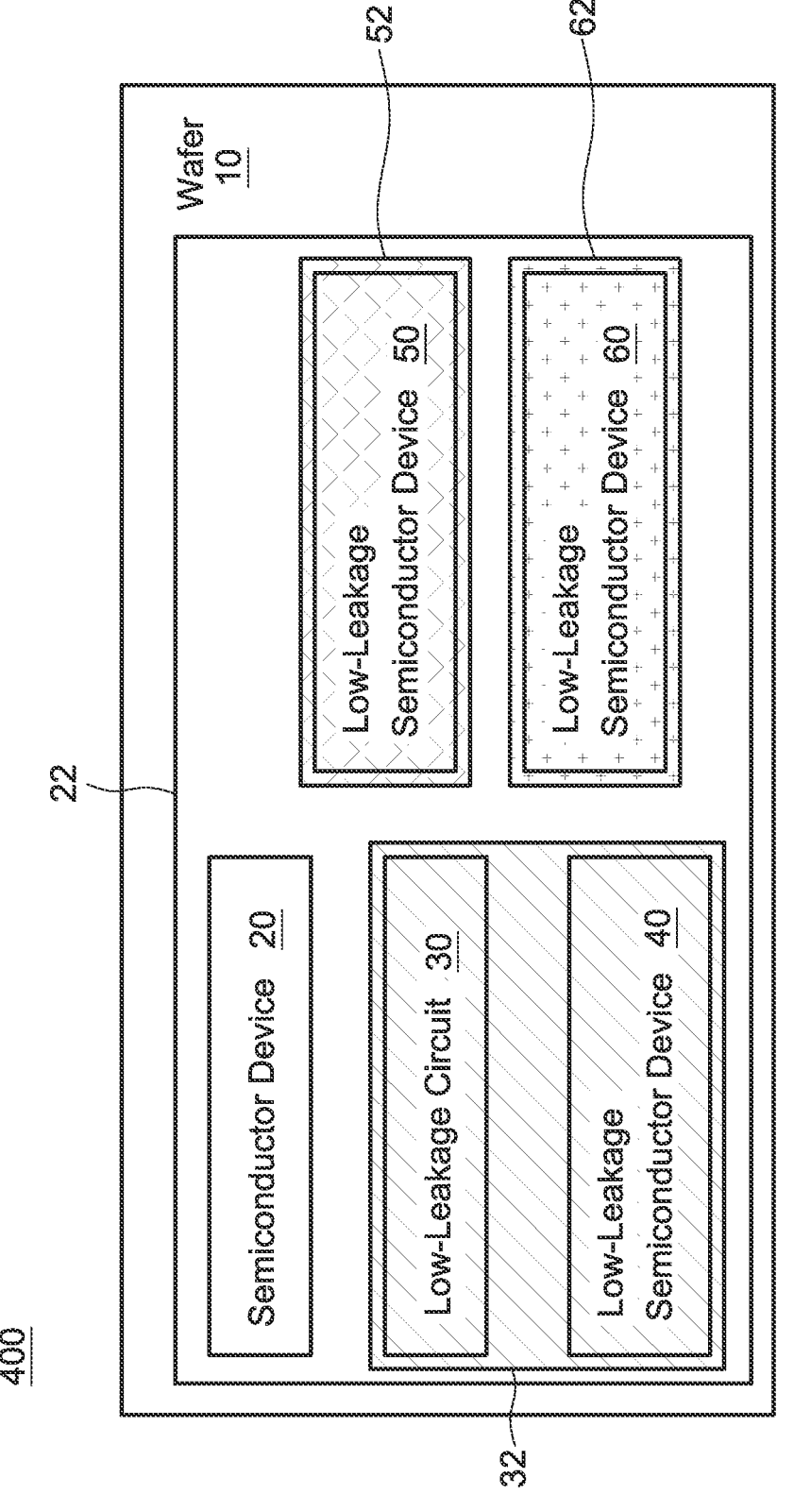
FIG. 4 illustrates a top view of a semiconductor product, in accordance with some embodiments of the present disclosure.

FIG. 4 is a top view of a semiconductor product 400, in accordance with some embodiments of the present disclosure. The semiconductor product 300 includes a wafer 10, a semiconductor device 20, a low-leakage circuit 30, a low-leakage semiconductor device 40, a low-leakage semiconductor device 50 and a low-leakage semiconductor device 60. The numbers of the semiconductor device 20, the low-leakage circuit 30, the low-leakage semiconductor device 40, a low-leakage semiconductor device 50 and the low-leakage semiconductor device 60 are not limited.

The semiconductor device 20 is formed within the wafer 10 or on the wafer 10. The semiconductor device 20 can include at least one transistor. The low-leakage circuit 30 is formed within the wafer 10 or on the wafer 10. The low-leakage circuit 30 can include at least one transistor. The low-leakage circuit 30 can be used to execute specific electronic function. The low-leakage circuit 30 can be a memory device. The low-leakage circuit 30 can be SRAM.

The low-leakage semiconductor device 40 is formed within the wafer 10. The low-leakage semiconductor device 40 is formed on the wafer 10. The low-leakage semiconductor device 40 can include a transistor, and the transistor can be an n-channel MOSFET or a p-channel MOSFET.

The low-leakage circuit 30 and the low-leakage semiconductor device 40 can be formed using a first set of additional masks 32. The first set of additional masks 32 can be used to form both of the low-leakage circuit 30 and the low-leakage semiconductor device 40. The low-leakage circuit 30 and the low-leakage semiconductor device 40 can be formed using the predetermined number of masks 22 and the first set of additional masks 32.

The number of masks for manufacturing the low-leakage circuit 30 and the low-leakage semiconductor device 40 can be different from the number of masks for manufacturing the semiconductor device 20. The number of masks for manufacturing the low-leakage circuit 30 and the low-leakage semiconductor device 40 can be greater than the number of masks for manufacturing the semiconductor device 20.

In some embodiments, the first set of additional masks 32 includes one additional mask. In some embodiments, the first set of additional masks 32 includes two additional masks. In some embodiments, the first set of additional masks 32 includes more than two additional masks.

The first set of additional masks 32 can be shared during the manufacturing process of forming the low-leakage circuit 30 and the low-leakage semiconductor device 40. The first set of additional masks 32 can be used to fabricate the low-leakage circuit 30 and the low-leakage semiconductor device 40 at the same manufacturing process. The first set of additional masks 32 can be used to fabricate the low-leakage circuit 30 and the low-leakage semiconductor device 40 at the same time. Therefore, the total number of masks for manufacturing the semiconductor product 200 can be reduced. The efficiency of fabricating the semiconductor product 200 can be improved. The cost for fabricating the semiconductor product 200 can be reduced.

The leakage current of the low-leakage circuit 30 can be different from that of the semiconductor device 20. The leakage current of the low-leakage circuit 30 can be lower than that of the semiconductor device 20. The semiconductor product 400 can include devices (i.e., the semiconductor device 20, the low-leakage circuit 30, the low-leakage semiconductor device 40, the low-leakage semiconductor device 50 and the low-leakage semiconductor device 60) of different levels of leakage current. By manufacturing devices of different levels of leakage current on a single wafer (i.e., wafer 10), variety of device types can be delivered for selection. By manufacturing devices of different levels of leakage current through leveraging the predetermined number of masks 22 (i.e., the predetermined number of masks 22 are utilized in the forming of the semiconductor device 20, the low-leakage circuit 30, the low-leakage semiconductor device 40, the low-leakage semiconductor device 50 and the low-leakage semiconductor device 60), the cost of manufacturing variety of device types can be decreased.

The threshold voltage of the transistor of the low-leakage circuit 30 can be different from that of the semiconductor device 20. The threshold voltage of the transistor of the low-leakage circuit 30 can be higher than that of the semiconductor device 20. The implant concentration of the channel of the low-leakage circuit 30 can be different from that of the semiconductor device 20. The implant concentration of the channel of the low-leakage circuit 30 can be higher than that of the semiconductor device 20.

The leakage current of the low-leakage semiconductor device 40 can be different from that of the semiconductor device 20. The leakage current of the low-leakage semiconductor device 40 can be lower than that of the semiconductor device 20.

The threshold voltage of the transistor of the low-leakage semiconductor device 40 can be different from that of the semiconductor device 20. The threshold voltage of the transistor of the low-leakage semiconductor device 40 can be higher than that of the semiconductor device 20. The implant concentration of the channel of the low-leakage semiconductor device 40 can be different from that of the semiconductor device 20. The implant concentration of the channel of the low-leakage semiconductor device 40 can be higher than that of the semiconductor device 20.

The low-leakage semiconductor device 50 is formed within the wafer 10. The low-leakage semiconductor device 50 is formed on the wafer 10. The low-leakage semiconductor device 50 can include a transistor, and the transistor can be an n-channel MOSFET or a p-channel MOSFET.

The low-leakage semiconductor device 50 can be formed using a second set of additional masks 52. The low-leakage semiconductor device 50 can be formed using the predetermined number of masks 22 and the second set of additional masks 52. In some embodiments, the second set of additional masks 52 includes one additional mask. In some embodiments, the second set of additional masks 52 includes two additional masks. In some embodiments, the second set of additional masks 52 includes more than two additional masks.

The number of masks for manufacturing the low-leakage semiconductor device 50 can be different from the number of masks for manufacturing the semiconductor device 20. The number of masks for manufacturing the low-leakage semiconductor device 50 can be greater than the number of masks for manufacturing the semiconductor device 20. The number of masks for manufacturing the low-leakage semiconductor device 50 can be identical to the number of masks for manufacturing the low-leakage device 30 and the low-leakage semiconductor device 40. The number of masks for manufacturing the low-leakage semiconductor device 50 can be different from the number of masks for manufacturing the low-leakage device 30 and the low-leakage semiconductor device 40.

The low-leakage semiconductor device 60 including at least one transistor can be formed using a third set of additional masks 62. The low-leakage semiconductor device 60 can be formed using the predetermined number of masks 22 and the third set of additional masks 62. The number of masks for manufacturing the low-leakage semiconductor device 60 can be different from the number of masks for manufacturing the low-leakage semiconductor device 50. The number of masks for manufacturing the low-leakage semiconductor device 60 can be greater than the number of masks for manufacturing the low-leakage semiconductor device 50.

In some embodiments, the third set of additional masks 62 includes one additional mask. In some embodiments, the third set of additional masks 62 includes two additional masks. In some embodiments, the third set of additional masks 62 includes three additional masks. In some embodiments, the third set of additional masks 62 includes four additional masks. In some embodiments, the third set of additional masks 62 includes more than four additional masks.

The leakage currents of the low-leakage semiconductor device 50 and the low-leakage semiconductor device 60 can be different from that of the semiconductor device 20. The leakage currents of the low-leakage semiconductor device 50 and the low-leakage semiconductor device 60 can be lower than that of the semiconductor device 20. The leakage current of the semiconductor product 202 can be reduced by adopting the low-leakage semiconductor device 50 and the low-leakage semiconductor device 60.

In addition, the transistor of the low-leakage semiconductor device 60 has LDD to further reduce the leakage current. Specifically, concentration of a first portion of a drain adjacent to the channel of the transistor of the low-leakage semiconductor device 60 can be different from that of a drain of the transistor of the semiconductor device 50. Concentration of a first portion of a drain adjacent to the channel of the transistor of the low-leakage semiconductor device 60 can be lower than that of a drain of the transistor of the semiconductor device 50.

Tables 1A and 1B illustrate various electronic features of the semiconductor device 20, the low-leakage circuit 30, the low-leakage semiconductor device 40, the low-leakage semiconductor device 50 and the low-leakage semiconductor device 60 of the semiconductor product 400 as shown in FIG. 4. The semiconductor device 20 can be regarded as a baseline to evaluate the electronic features, such as the threshold voltage and the leakage current, of other circuits and devices. The values shown in Tables 1A and 1B are merely examples and not intended to be limiting.

TABLE 1A

|  |  | Semiconductor Device 20 | Low-Leakage Circuit 30 | Low-Leakage Semiconductor Device 40 |
|---|---|---|---|---|
| Mask | Additional number of masks used | baseline |  | +2 |
|  | Low-Leakage Circuit 30 |  | YES | YES |
|  | Low-Leakage Semiconductor Device 50 |  | None | None |
|  | Low-Leakage Semiconductor Device 60 |  | None | None |
| Device | Threshold Voltage (N/P) | baseline | +60 mV | +45 mV/+35 mV |
|  | Off Current (N/P) |  | 0.41x | 0.35x/0.40x |
|  | Saturation Current (N/P) |  | −45% | −16%/−15% |
| Device Implant | Channel | baseline |  | High |
|  | LDD |  | None | None |

As illustrated in Table 1A, compared to manufacture of the semiconductor device 20, two additional masks are used to fabricate the low-leakage circuit 30 and/or the low-leakage semiconductor device 40. The threshold voltage (Vth) of the transistor of the low-leakage circuit 30 is greater than that of the semiconductor device 20 by 60 mV. The off current (Ioff) of the transistor of the low-leakage circuit 30 is 0.41 times of that of the semiconductor device 20. The saturation current (Isat) of the transistor of the low-leakage circuit 30 is lower than that of the semiconductor device 20 by 45%.

In addition, the Vth of the NMOS transistor of the low-leakage semiconductor device 40 is greater than that of the semiconductor device 20 by 45 mV. The Vth of the PMOS transistor of the low-leakage semiconductor device 40 is greater than that of the semiconductor device 20 by 35 mV. The Ioff of the NMOS transistor of the low-leakage semiconductor device 40 is 0.35 times of that of the semiconductor device 20. The Ioff of the PMOS transistor of the low-leakage semiconductor device 40 is 0.40 times of that of the semiconductor device 20. The Isat of the NMOS transistor of the low-leakage semiconductor device 40 is lower than that of the semiconductor device 20 by 16%. The Isat of the PMOS transistor of the low-leakage semiconductor device 40 is lower than that of the semiconductor device 20 by 15%. Implant concentration of the channel of the transistors of the low-leakage circuit 30 and the low-leakage semiconductor device 40 is higher than that of the transistors of the semiconductor device 20.

As illustrated in Table 1B, compared to manufacture of semiconductor device 20, two additional masks are used to fabricate the low-leakage semiconductor device 50. The Vth of the NMOS transistor of the low-leakage semiconductor device 50 is greater than that of the semiconductor device 20 by 65 mV. The Vth of the PMOS transistor of the low-leakage semiconductor device 50 is greater than that of the semiconductor device 20 by 35 mV.

TABLE 1B

|  |  | Low-Leakage Semiconductor Device 50 | Low-Leakage Semiconductor Device 60 (Vth = 0.7 V) | Low-Leakage Semiconductor Device 60 (Vth = 0.8 V) |
|---|---|---|---|---|
| Mask | Additional number of masks used | +2 | +4 | |
|  | Low-Leakage Circuit 30 | None | None | None |
|  | Low-Leakage Semiconductor Device 50 | YES | None | None |
|  | Low-Leakage Semiconductor Device 60 | None | YES | |
| Device | Threshold Voltage (N/P) | +65 mV/+35 mV | +100 mV/+90 mV | |
|  | Off Current (N/P) | 0.2x/0.4x | 0.02x/0.03x | 0.15x/0.06x |
|  | Saturation Current (N/P) | −25%/−15% | −68%/−65% | −43%/−38% |
| Device Implant | Channel | Higher | Highest | |
|  | LDD | None | YES | |

The Ioff of the NMOS transistor of the low-leakage semiconductor device 50 is 0.20 times of that of the semiconductor device 20. The Ioff of the PMOS transistor of the low-leakage semiconductor device 50 is 0.40 times of that of the semiconductor device 20. The Isat of the NMOS transistor of the low-leakage semiconductor device 50 is lower than that of the semiconductor device 20 by 25%. The Isat of the PMOS transistor of the low-leakage semiconductor device 50 is lower than that of the semiconductor device 20 by 15%. Implant concentration of the channel of the transistor s of the low-leakage semiconductor device 50 is higher than that of the transistors of the semiconductor device 20, the low-leakage circuit 30 and the low-leakage semiconductor device 40.

Furthermore, compared to manufacture of semiconductor device 20, four additional masks are used to fabricate the low-leakage semiconductor device 60. The Vth of the NMOS transistor of the low-leakage semiconductor device 60 is greater than that of the semiconductor device 20 by 100 mV. The Vth of the PMOS transistor of the low-leakage semiconductor device 60 is greater than that of the semiconductor device 20 by 90 mV.

The Ioff of the NMOS transistor of the low-leakage semiconductor device 60 (when Vth is 0.7V) is 0.02 times of that of the semiconductor device 20. The Ioff of the PMOS transistor of the low-leakage semiconductor device 60 (when Vth is 0.7V) is 0.03 times of that of the semiconductor device 20. The Ioff of the NMOS transistor of the low-leakage semiconductor device 60 (when Vth is 0.8V) is 0.15 times of that of the semiconductor device 20. The Ioff of the PMOS transistor of the low-leakage semiconductor device 60 (when Vth is 0.8V) is 0.06 times of that of the semiconductor device 20.

The Isat of the NMOS transistor of the low-leakage semiconductor device 60 (when Vth is 0.7V) is lower than that of the semiconductor device 20 by 68%. The Isat of the PMOS transistor of the low-leakage semiconductor device 60 (when Vth is 0.7V) is lower than that of the semiconductor device 20 by 65%. The Isat of the NMOS transistor of the low-leakage semiconductor device 60 (when Vth is 0.8V) is lower than that of the semiconductor device 20 by 43%. The Isat of the PMOS transistor of the low-leakage semiconductor device 60 (when Vth is 0.8V) is lower than that of the semiconductor device 20 by 38%.

Implant concentration of the channels of the transistors of the low-leakage semiconductor device 60 is higher than those of the transistors of the semiconductor device 20, the low-leakage circuit 30, the low-leakage semiconductor device 40 and the low-leakage semiconductor device 50. The transistors of the low-leakage semiconductor device 60 utilize LDD structure so that the leakage current of the semiconductor product 400 can be reduced.

Figure 5:
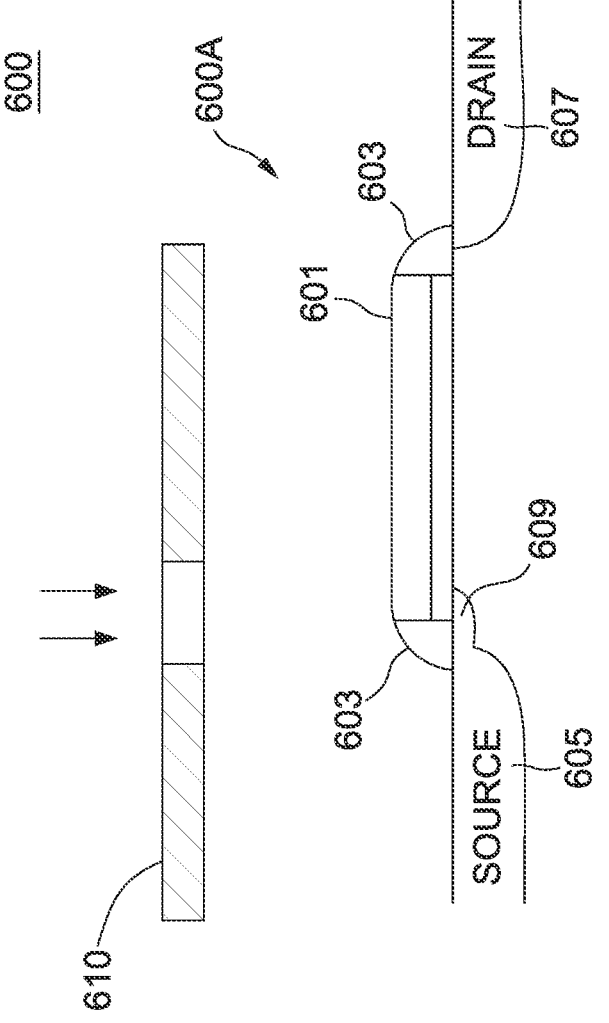
FIG. 5 illustrates a cross-section view of a low-leakage semiconductor product, in accordance with some embodiments of the present disclosure.

FIG. 5 is a cross-section of a low-leakage semiconductor product 600, in accordance with some embodiments of the present disclosure. The low-leakage semiconductor product 600 can include at least one transistor 600A. The transistor 600A can include a gate 601, sidewall spacers 603, lightly doped drain (LDD) region 609, source region 605 and drain region 607. The sidewall spacers 603 are used to form LDD structures. Source region 605 and drain region 607 are formed using ion implants. The LDD region 609 can help to reduce the leakage current of the transistor 600A.

In general, additional masks 610 are utilized to form the LDD regions. Therefore, the manufacturing of a semiconductor device with a lower leakage current can in general correspond to the usage of more masks.

The amounts of LDD regions are not limited. The transistor 600A of FIG. 5 includes one LDD region 609. In some embodiments, the transistor 600A can include more than one LDD regions. The LDD region 609 can be formed on the source region 605, making the transistor asymmetrical. In some embodiments, the LDD region 609 can be formed on the drain region 607, making the transistor asymmetrical. In some embodiments, the transistor 600A can have two LDD regions 609. The transistor 600A can have more than two LDD regions 609. The lightly doped drain regions 609 can be formed on the source 605 and the drain 607, making the transistor symmetrical.

Figure 6A:
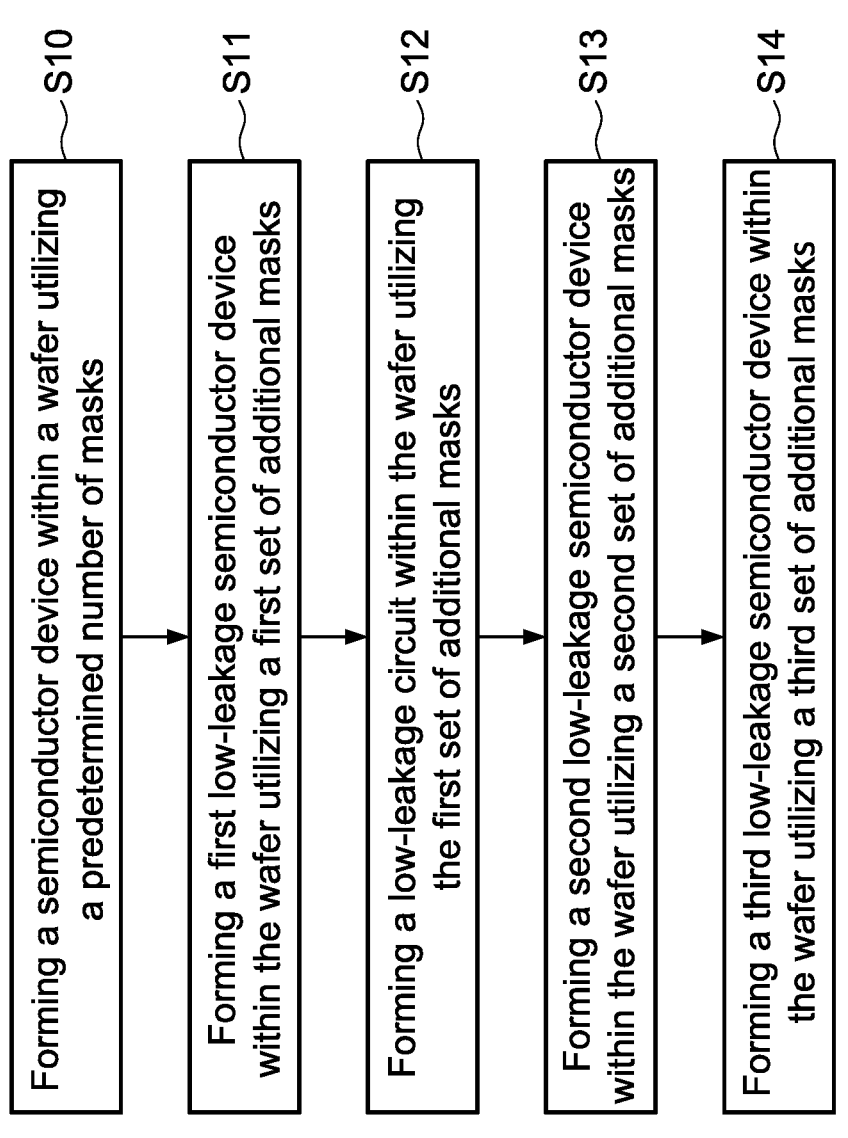
FIG. 6A illustrates a flow chart including operations for manufacturing a semiconductor product, in accordance with some embodiments of the present disclosure.

FIG. 6A is a flowchart of operations for manufacturing a semiconductor product, in accordance with some embodiments of the present disclosure. The flowchart of FIG. 6A includes operations S10, S11, S12, S13, and S14. Although the operations S10, S11, S12, S13, and S14 of FIG. 6A are depicted in sequence, the operations S10, S11, S12, S13, and S14 can be performed in an order different from that shown in FIG. 6A.

In operation S10, a semiconductor device within a wafer utilizing a predetermined number of masks is formed. In operation S11, a first low-leakage semiconductor device within the wafer utilizing a first set of additional masks is formed. In operation S12, a low-leakage circuit within the wafer utilizing the first set of additional masks is formed. The first set of additional masks can be used to form the first low-leakage semiconductor device and the low-leakage circuit. Compared with utilizing different masks to form the first low-leakage semiconductor device and the low-leakage circuit, the total number of masks can be reduced by applying the operations S11 and S12 to reduce the manufacturing cost of the semiconductor product.

In operation S13, a second low-leakage semiconductor device within the wafer utilizing a second set of additional masks is formed. In operation S14, a third low-leakage semiconductor device within the wafer utilizing a third set of additional masks is formed. The number of masks for manufacturing the semiconductor product can be adjusted flexibly and optimized efficiently by applying the operations of FIG. 6A according to need.

FIG. 6B is a flowchart of operations for manufacturing a semiconductor product, in accordance with some embodiments of the present disclosure. The flowchart of FIG. 6B includes operations S20, S21, S22, S23, and S24. Although the operations S20, S21, S22, S23, and S24 of FIG. 6B are depicted in sequence, the operations S20, S21, S22, S23, and S24 can be performed in an order different from that shown in FIG. 6B.

In operation S20, a semiconductor device having a first transistor within a wafer utilizing a predetermined number of masks is formed. In operation S21, a low-leakage circuit having a second transistor within the wafer utilizing the predetermined number of masks and a first set of additional masks is formed. In operation S22, a first low-leakage semiconductor device having a third transistor within the wafer utilizing the predetermined number of masks and the first set of additional masks is formed. The first set of additional masks can be used to form the first low-leakage semiconductor device and the low-leakage circuit. Compared with utilizing different masks to form the first low-leakage semiconductor device and the low-leakage circuit, the total number of masks can be reduced by applying the operations S21 and S22.

In operation S23, a second low-leakage semiconductor device having a fourth transistor within the wafer utilizing the predetermined number of masks and a second set of additional masks is formed. In operation S24, a third low-leakage semiconductor device having a fifth transistor within the wafer utilizing the predetermined number of masks and a third set of additional masks is formed. The number of masks for manufacturing the semiconductor product can be adjusted flexibly and optimized efficiently by applying the operations of FIG. 6B according to need.

Figure 7:
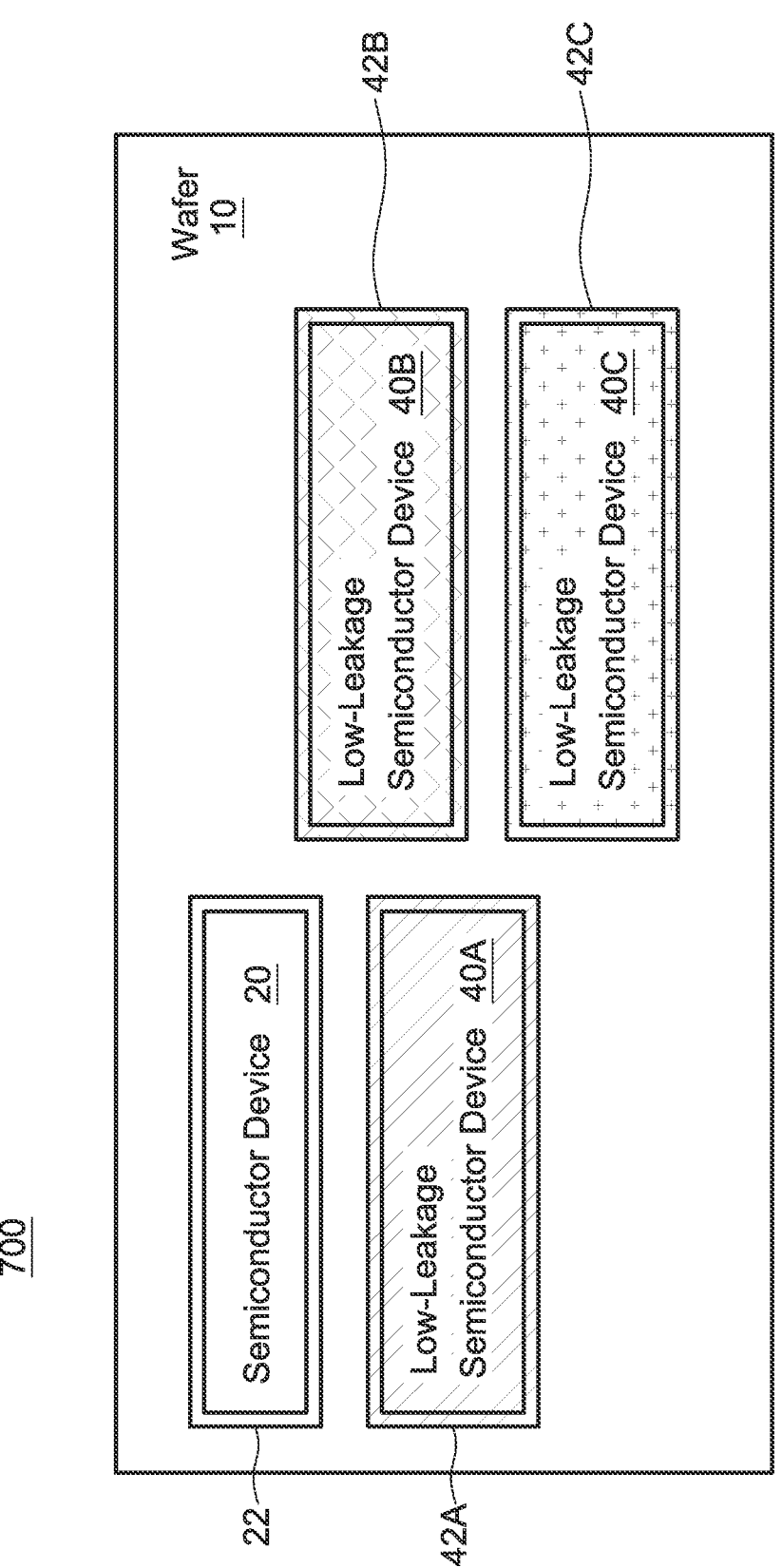
FIG. 7 illustrates a top view of a semiconductor product, in accordance with some comparative embodiments of the present disclosure.

FIG. 7 is a top view of a semiconductor product 700, in accordance with some comparative embodiments of the present disclosure. The semiconductor product 700 includes a wafer 10, a semiconductor device 20 and low-leakage semiconductor devices 40A, 40B, and 40C. The number of low-leakage semiconductor devices 40A to 40C is not limited.

The semiconductor device 20 is formed within the wafer 10. The semiconductor device 20 is formed on the wafer 10. The semiconductor device 20 can include a transistor, and the transistor can be an n-channel MOSFET or a p-channel MOSFET. The semiconductor device 20 can be formed using a predetermined number of masks 22.

The low-leakage semiconductor devices 40A, 40B, and 40C are formed within the wafer 10. The low-leakage semiconductor devices 40A, 40B, and 40C are formed on the wafer 10. Each of the low-leakage semiconductor devices 40A, 40B, and 40C can include a transistor, and the transistor can be an n-channel MOSFET or a p-channel MOSFET.

The low-leakage semiconductor devices 40A, 40B, and 40C can be formed using different sets of additional masks. The low-leakage semiconductor device 40A can be formed using a first set of additional masks 42A. The low-leakage semiconductor device 40B can be formed using a second set of additional masks 42B. The low-leakage semiconductor device 40C can be formed using a third set of additional masks 42C.

The first set of additional masks 42A, the second set of additional masks 42B and the third set of additional masks 42C are different. None of the first set of additional masks 42A, the second set of additional masks 42B and the third set of additional masks 42C can be shared to form the low-leakage semiconductor devices 40A, 40B, and 40C. Therefore, the total number of masks for manufacturing the semiconductor product 700 cannot be reduced. The efficiency of fabricating the semiconductor product 700 can be deteriorated. The cost for fabricating the semiconductor product 700 can be increased.

Some embodiments of the present disclosure provide a method for manufacturing a semiconductor product. The method comprises forming a semiconductor device within a wafer utilizing a predetermined number of masks. The method further comprises forming a first low-leakage semiconductor device within the wafer utilizing a first set of additional masks. The first low-leakage semiconductor device has a lower leakage current than that of the semiconductor device.

Some embodiments of the present disclosure provide a method for manufacturing a semiconductor product. The method comprises forming a semiconductor device having a first transistor within a wafer utilizing a predetermined number of masks. The method further comprises forming a low-leakage circuit having a second transistor within the wafer utilizing the predetermined number of masks and a first set of additional masks. Implant concentration of the channel of the second transistor is higher than that of the first transistor.

Some embodiments of the present disclosure provide a semiconductor product. The semiconductor product comprises a semiconductor device, a low-leakage circuit and a first low-leakage semiconductor device. The semiconductor device includes a first transistor arranged in a wafer. The low-leakage circuit includes a second transistor arranged in the wafer. The first low-leakage semiconductor device having a third transistor arranged in the wafer. Implant concentration of the channel of the second transistor is different than that of the first transistor. Implant concentration of the channel of the third transistor is substantially identical to that of the second transistor.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor product, comprising:

forming a semiconductor device within a wafer utilizing a predetermined number of masks;

forming a first low-leakage semiconductor device within the wafer utilizing the predetermined number of masks and a first set of additional masks, wherein the first set of additional masks comprises two additional masks, the first low-leakage semiconductor device has a lower leakage current than that of the semiconductor device, the first low-leakage semiconductor device has a lower saturation current than that of the semiconductor device, implant concentration of a channel of the first low-leakage semiconductor device is higher than that of the semiconductor device, and the first set of additional masks are utilized to form a lightly doped drain (LDD) region on the first low-leakage semiconductor device so that the first low-leakage semiconductor device is used as a memory device; and forming a low-leakage circuit within the wafer utilizing the first set of additional masks, wherein the low-leakage circuit and the first low-leakage semiconductor device are fabricated at the same time by utilizing the first set of additional masks.

2. The method of claim 1, wherein the low-leakage circuit has a lower leakage current than that of the semiconductor device, and implant concentration of a channel of the low-leakage circuit is higher than that of the semiconductor device.

3. The method of claim 2, further comprising forming a second low-leakage semiconductor device within the wafer utilizing a second set of additional masks, wherein the second low-leakage semiconductor device has a lower leakage current than that of the first low-leakage semiconductor device, and the second set of additional masks are utilized to increase implant concentration of a channel of the second low-leakage semiconductor device to be higher than that of the first low-leakage semiconductor device.

4. The method of claim 3, further comprising forming a third low-leakage semiconductor device within the wafer utilizing a third set of additional masks, wherein the third low-leakage semiconductor device has lower leakage current than that of the second low-leakage device, and the third set of additional masks are utilized to increase implant concentration of a channel of the third low-leakage semiconductor device to be higher than that of the second low-leakage semiconductor device.

5. The method of claim 4, wherein the first set of additional masks includes a first number of masks and the third set of additional masks includes a third number of masks, and wherein the first number is different than the third number.

6. The method of claim 1, further comprising forming a second low-leakage semiconductor device within the wafer utilizing a second set of additional masks, wherein the second low-leakage semiconductor device has a lower leakage current than the first low-leakage semiconductor device, and the second set of additional masks are utilized to increase implant concentration of a channel of the second low-leakage semiconductor device to be higher than that of the first low-leakage semiconductor device.

7. The method of claim 6, further comprising forming a third low-leakage semiconductor device within the wafer utilizing a third set of additional masks, wherein the third low-leakage semiconductor device has a lower leakage current than the second low-leakage semiconductor device, and the third set of additional masks are utilized to increase implant concentration of a channel of the third low-leakage semiconductor device to be higher than that of the second low-leakage semiconductor device.

8. The method of claim 1, further comprising forming a second low-leakage semiconductor device within the wafer utilizing a third set of additional masks, wherein the second low-leakage semiconductor device has a lower leakage current than the first low-leakage semiconductor device, and the third set of additional masks are utilized to increase implant concentration of a channel of the second low-leakage semiconductor device to be higher than that of the first low-leakage semiconductor device.

9. A method for manufacturing a semiconductor product, comprising:

forming a semiconductor device having a first transistor within a wafer utilizing a predetermined number of masks;

forming a low-leakage circuit having a second transistor within the wafer utilizing the predetermined number of masks and a first set of additional masks, wherein the first set of additional masks comprises two additional masks, implant concentration of the channel of the second transistor is higher than that of the first transistor, and a saturation current of the second transistor is lower than that of the first transistor; and forming a first low-leakage semiconductor device having a third transistor within the wafer utilizing the predetermined number of masks and the first set of additional masks, wherein the first set of additional masks are utilized to form a lightly doped drain (LDD) region on the first low-leakage semiconductor device so that the first low-leakage semiconductor device is used as a memory device, and a saturation current of the third transistor is lower than that of the first transistor, wherein the low-leakage circuit and the first low-leakage semiconductor device are fabricated at the same time by utilizing the first set of additional masks.

10. The method of claim 9, wherein implant concentration of the channel of the third transistor is substantially identical to that of the second transistor.

11. The method of claim 10, further comprising forming a second low-leakage semiconductor device having a fourth transistor within the wafer utilizing the predetermined number of masks and a second set of additional masks, wherein the second set of additional masks are utilized to increase implant concentration of the channel of the fourth transistor to be higher than that of the third transistor.

12. The method of claim 11, further comprising forming a third low-leakage semiconductor device having a fifth transistor within the wafer utilizing the predetermined number of masks and a third set of additional masks, wherein the third set of additional masks are utilized to increase implant concentration of the channel of the fifth transistor to be higher than that of the fourth transistor.

13. The method of claim 12, wherein implant concentration of a first portion of a drain adjacent to the channel of the fifth transistor is lower than that of a drain of the fourth transistor.

14. The method of claim 12, wherein a threshold voltage of the fourth transistor is higher than that of the third transistor, and a threshold voltage of the fifth transistor is higher than that of the fourth transistor.

15. The method of claim 12, wherein the first set of additional masks includes a first number of masks and the second set of additional masks includes a second number of masks, and wherein the first number is identical to the second number.

16. The method of claim 12, wherein the first set of additional masks includes a first number of masks and the third set of additional masks includes a third number of masks, and wherein the first number is different than the third number.

17. A method for manufacturing a semiconductor product, comprising:

forming a semiconductor device including a first transistor arranged in a wafer by utilizing a predetermined number of masks;

forming a low-leakage circuit including a second transistor arranged in the wafer by utilizing the predetermined number of masks and a first set of additional masks, wherein the first set of additional masks comprises two additional masks, a saturation current of the second transistor is lower than that of the first transistor; and forming a first low-leakage semiconductor device having a third transistor arranged in the wafer, wherein implant concentration of the channel of the second transistor is different than that of the first transistor, a saturation current of the third transistor is lower than that of the first transistor, and wherein implant concentration of the channel of the third transistor is substantially identical to that of the second transistor, and the first set of additional masks are utilized to form a lightly doped drain (LDD) region on the first low-leakage semiconductor device so that the first low-leakage semiconductor device is used as a memory device, wherein the low-leakage circuit and the first low-leakage semiconductor device are fabricated at the same time by utilizing the first set of additional masks.

18. The method of claim 17, further comprising:

forming a second low-leakage semiconductor device having a fourth transistor arranged in the wafer, wherein implant concentration of the channel of the fourth transistor is different than that of the third transistor.

19. The method of claim 18, further comprising:

forming a third low-leakage semiconductor device having a fifth transistor arranged in the wafer, wherein implant concentration of the channel of the fifth transistor is different than that of the fourth transistor.

20. The method of claim 19, wherein implant concentration of a first portion of a drain adjacent to the channel of the fifth transistor is lower than that of a drain of the fourth transistor.

* * * * *